US009234669B2

(12) United States Patent
Filson et al.

(10) Patent No.: US 9,234,669 B2
(45) Date of Patent: *Jan. 12, 2016

(54) INTEGRATING SENSING SYSTEMS INTO THERMOSTAT HOUSING IN MANNERS FACILITATING COMPACT AND VISUALLY PLEASING PHYSICAL CHARACTERISTICS THEREOF

(71) Applicant: Google Inc., Mountain View, CA (US)

(72) Inventors: John Benjamin Filson, Mountain View, CA (US); Eric B. Daniels, East Palo Alto, CA (US); Brian Huppi, San Francisco, CA (US)

(73) Assignee: GOOGLE INC., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/290,760

(22) Filed: May 29, 2014

(65) Prior Publication Data
US 2014/0346362 A1 Nov. 27, 2014

Related U.S. Application Data

(63) Continuation of application No. 14/038,270, filed on Sep. 26, 2013, now Pat. No. 8,766,194, which is a continuation of application No. 13/624,881, filed on Sep. 21, 2012, now Pat. No. 8,558,179.

(60) Provisional application No. 61/627,996, filed on Oct. 21, 2011.

(51) Int. Cl.
*G05D 23/27* (2006.01)
*F24F 11/00* (2006.01)
(Continued)

(52) U.S. Cl.
CPC ............. *F24F 11/0009* (2013.01); *F24F 11/00* (2013.01); *F24F 11/001* (2013.01);
(Continued)

(58) Field of Classification Search
CPC .......... G05D 23/1932; G05D 23/2434; G05D 23/2723; F24F 2011/0036; F24F 11/053
USPC ........................................................ 250/349
See application file for complete search history.

(56) References Cited

U.S. PATENT DOCUMENTS 4,114,988 A 9/1978 Enomoto
4,129,847 A 12/1978 Teichert
(Continued)

FOREIGN PATENT DOCUMENTS

CA 2202008 2/2000
DE 19728803 C1 8/1999
(Continued)

OTHER PUBLICATIONS

Aprilaire Electronic Thermostats Model 8355 User's Manual, Research Products Corporation, Dec. 2000, 16 pages.
(Continued)

*Primary Examiner* — Marcus Taningco
(74) *Attorney, Agent, or Firm* — Kilpatrick Towsend & Stockton, LLP

(57) ABSTRACT

An occupancy sensing electronic thermostat is described that includes a thermostat body, an electronic display that is viewable by a user in front of the thermostat, a passive infrared sensor for measuring infrared energy and an infrared energy directing element formed integrally with a front surface of the thermostat body. The passive infrared sensor may be positioned behind the infrared energy directing element such that infrared energy is directed thereonto by the infrared energy directing element. The thermostat may also include a temperature sensor and a microprocessor programmed to detect occupancy based on measurements from the passive infrared sensor.

16 Claims, 19 Drawing Sheets

(51) Int. Cl.

| | | |
|---|---|---|
| *G05D 23/19* | (2006.01) | |
| *G06F 3/0487* | (2013.01) | |
| *G05D 23/24* | (2006.01) | |
| *G01J 5/00* | (2006.01) | |
| *G01J 5/04* | (2006.01) | |
| *G06N 99/00* | (2010.01) | |
| *H04L 29/08* | (2006.01) | |
| *G01K 1/02* | (2006.01) | |
| *G05B 15/02* | (2006.01) | |

(52) U.S. Cl.
CPC ........... *F24F11/006* (2013.01); *F24F 11/0012* (2013.01); *F24F 11/0034* (2013.01); *F24F 11/0076* (2013.01); *F24F 11/0086* (2013.01); *G01J 5/0025* (2013.01); *G01J 5/041* (2013.01); *G01K 1/02* (2013.01); *G05B 15/02* (2013.01); *G05D 23/19* (2013.01); *G05D 23/1902* (2013.01); *G05D 23/1919* (2013.01); *G05D 23/1932* (2013.01); *G05D 23/2434* (2013.01); *G05D 23/2723* (2013.01); *G06F 3/0487* (2013.01); *G06N 99/005* (2013.01); *H04L 67/10* (2013.01); *F24F 2011/0035* (2013.01); *F24F 2011/0036* (2013.01); *F24F 2011/0071* (2013.01); *F24F 2011/0091* (2013.01); *Y02B 60/50* (2013.01); *Y02T 10/88* (2013.01)

(56) References Cited

U.S. PATENT DOCUMENTS

| | | | |
|---|---|---|---|
| 4,157,506 A | 6/1979 | Spencer | |
| 4,211,922 A | 7/1980 | Vaerewyck et al. | |
| 4,223,831 A | 9/1980 | Szarka | |
| 4,335,847 A | 6/1982 | Levine | |
| 4,342,033 A | 7/1982 | De Camargo | |
| 4,408,711 A | 10/1983 | Levine | |
| 4,615,380 A | 10/1986 | Beckey | |
| 4,669,654 A | 6/1987 | Levine et al. | |
| 4,674,027 A | 6/1987 | Beckey | |
| 4,685,614 A | 8/1987 | Levine | |
| 4,701,037 A | 10/1987 | Bramer | |
| 4,751,961 A | 6/1988 | Levine et al. | |
| 4,895,455 A | 1/1990 | Horning | |
| 4,897,798 A | 1/1990 | Cler | |
| 5,088,645 A | 2/1992 | Bell | |
| 5,211,332 A | 5/1993 | Adams | |
| 5,240,178 A | 8/1993 | Dewolf et al. | |
| 5,393,978 A | 2/1995 | Schwarz | |
| 5,395,042 A | 3/1995 | Riley et al. | |
| 5,476,221 A | 12/1995 | Seymour | |
| 5,499,196 A | 3/1996 | Pacheco | |
| 5,555,927 A | 9/1996 | Shah | |
| 5,611,484 A | 3/1997 | Uhrich | |
| 5,697,063 A | 12/1997 | Kishigami et al. | |
| 5,697,552 A | 12/1997 | McHugh et al. | |
| 5,802,467 A | 9/1998 | Salazar et al. | |
| 5,819,164 A | 10/1998 | Sun et al. | |
| 5,819,840 A | 10/1998 | Wilson et al. | |
| 5,902,183 A | 5/1999 | D'Souza | |
| 5,909,378 A | 6/1999 | De Milleville | |
| 5,977,964 A | 11/1999 | Williams et al. | |
| 6,032,867 A | 3/2000 | Dushane et al. | |
| 6,062,482 A | 5/2000 | Gauthier et al. | |
| 6,098,893 A | 8/2000 | Berglund et al. | |
| 6,216,956 B1 | 4/2001 | Ehlers et al. | |
| 6,219,553 B1 | 4/2001 | Panasik | |
| 6,285,912 B1 | 9/2001 | Ellison et al. | |
| 6,286,764 B1 | 9/2001 | Garvey et al. | |
| 6,349,883 B1 | 2/2002 | Simmons et al. | |
| 6,356,204 B1 | 3/2002 | Guindi et al. | |
| 6,478,233 B1 | 11/2002 | Shah | |
| 6,513,723 B1 | 2/2003 | Mueller et al. | |
| 6,604,023 B1 | 8/2003 | Brown et al. | |
| 6,622,115 B1 | 9/2003 | Brown et al. | |
| 6,645,066 B2 | 11/2003 | Gutta et al. | |
| 6,769,482 B2 | 8/2004 | Wagner et al. | |
| 6,798,341 B1 | 9/2004 | Eckel et al. | |
| 6,824,069 B2 | 11/2004 | Rosen | |
| 6,851,621 B1 | 2/2005 | Wacker et al. | |
| 6,891,838 B1 | 5/2005 | Petite et al. | |
| 6,983,889 B2 | 1/2006 | Alles | |
| 6,997,390 B2 | 2/2006 | Alles | |
| 7,024,336 B2 | 4/2006 | Salsbury et al. | |
| 7,035,805 B1 | 4/2006 | Miller | |
| 7,058,477 B1 | 6/2006 | Rosen | |
| 7,083,109 B2 | 8/2006 | Pouchak | |
| 7,109,970 B1 | 9/2006 | Miller | |
| 7,114,554 B2 | 10/2006 | Bergman et al. | |
| 7,156,316 B2 | 1/2007 | Kates | |
| 7,164,932 B1 | 1/2007 | Sato et al. | |
| 7,168,627 B2 | 1/2007 | Kates | |
| 7,209,703 B1 | 4/2007 | Yarkosky | |
| 7,222,800 B2 | 5/2007 | Wruck | |
| 7,225,054 B2 | 5/2007 | Amundson et al. | |
| 7,333,880 B2 | 2/2008 | Brewster et al. | |
| RE40,437 E | 7/2008 | Rosen | |
| 7,427,926 B2 | 9/2008 | Sinclair et al. | |
| 7,432,858 B2 | 10/2008 | Arndt et al. | |
| 7,469,550 B2 | 12/2008 | Chapman, Jr. et al. | |
| 7,587,173 B2 | 9/2009 | Hoffmann et al. | |
| 7,605,714 B2 | 10/2009 | Thompson et al. | |
| 7,644,869 B2 | 1/2010 | Hoglund et al. | |
| 7,693,582 B2 | 4/2010 | Bergman et al. | |
| 7,702,424 B2 | 4/2010 | Cannon et al. | |
| 7,784,704 B2 | 8/2010 | Harter | |
| 7,802,618 B2 | 9/2010 | Simon et al. | |
| 7,848,900 B2 | 12/2010 | Steinberg et al. | |
| 7,854,389 B2 | 12/2010 | Ahmed | |
| 7,890,195 B2 | 2/2011 | Bergman et al. | |
| 7,900,849 B2 | 3/2011 | Barton et al. | |
| 7,918,406 B2 | 4/2011 | Rosen | |
| 8,010,237 B2 | 8/2011 | Cheung et al. | |
| 8,019,567 B2 | 9/2011 | Steinberg et al. | |
| 8,090,477 B1 | 1/2012 | Steinberg | |
| 8,131,497 B2 | 3/2012 | Steinberg et al. | |
| 8,180,492 B2 | 5/2012 | Steinberg | |
| 8,280,536 B1 | 10/2012 | Fadell et al. | |
| 8,558,179 B2 | 10/2013 | Filson et al. | |
| 2002/0034958 A1 | 3/2002 | Oberschmidt et al. | |
| 2002/0134849 A1 | 9/2002 | Disser | |
| 2003/0034898 A1 | 2/2003 | Shamoon et al. | |
| 2003/0177012 A1 | 9/2003 | Drennan | |
| 2003/0183620 A1 | 10/2003 | Wong | |
| 2004/0173457 A1 | 9/2004 | Miller et al. | |
| 2004/0249479 A1 | 12/2004 | Shorrock | |
| 2004/0256472 A1 | 12/2004 | DeLuca | |
| 2005/0043907 A1 | 2/2005 | Eckel et al. | |
| 2005/0054299 A1 | 3/2005 | Hein et al. | |
| 2005/0128067 A1 | 6/2005 | Zakrewski | |
| 2005/0189429 A1 | 9/2005 | Breeden | |
| 2005/0192915 A1 | 9/2005 | Ahmed et al. | |
| 2005/0199737 A1 | 9/2005 | De Pauw et al. | |
| 2005/0209813 A1 | 9/2005 | Kautz et al. | |
| 2005/0270151 A1 | 12/2005 | Winick | |
| 2005/0279841 A1 | 12/2005 | Schwendinger et al. | |
| 2005/0280421 A1 | 12/2005 | Yomoda et al. | |
| 2006/0009863 A1 | 1/2006 | Lingemann | |
| 2006/0084379 A1 | 4/2006 | O'Neill | |
| 2006/0105697 A1 | 5/2006 | Aronstam et al. | |
| 2006/0186214 A1 | 8/2006 | Simon et al. | |
| 2006/0196953 A1 | 9/2006 | Simon et al. | |
| 2007/0115902 A1 | 5/2007 | Shamoon et al. | |
| 2007/0158444 A1 | 7/2007 | Naujok et al. | |
| 2007/0173978 A1 | 7/2007 | Fein et al. | |
| 2007/0225867 A1 | 9/2007 | Moorer et al. | |
| 2007/0228183 A1 | 10/2007 | Kennedy et al. | |
| 2007/0241203 A1 | 10/2007 | Wagner et al. | |
| 2007/0278320 A1 | 12/2007 | Lunacek et al. | |
| 2007/0287384 A1 | 12/2007 | Sadri et al. | |
| 2008/0015742 A1 | 1/2008 | Kulyk et al. | |
| 2008/0099568 A1 | 5/2008 | Nicodem et al. | |
| 2008/0108369 A1 | 5/2008 | Visotsky et al. | |

(56) References Cited

U.S. PATENT DOCUMENTS

| | | |
|---|---|---|
| 2008/0191045 A1 | 8/2008 | Harter |
| 2008/0273754 A1 | 11/2008 | Hick et al. |
| 2008/0317292 A1 | 12/2008 | Baker et al. |
| 2009/0124199 A1 | 5/2009 | Maltsev et al. |
| 2009/0127078 A1 | 5/2009 | Hostmann et al. |
| 2009/0140057 A1 | 6/2009 | Leen |
| 2009/0140060 A1 | 6/2009 | Stoner et al. |
| 2009/0171862 A1 | 7/2009 | Harrod et al. |
| 2009/0215534 A1 | 8/2009 | Wilson et al. |
| 2009/0219903 A1 | 9/2009 | Alamouti et al. |
| 2009/0249787 A1 | 10/2009 | Pfahl et al. |
| 2009/0254225 A1 | 10/2009 | Boucher et al. |
| 2009/0259713 A1 | 10/2009 | Blumrich et al. |
| 2009/0297901 A1 | 12/2009 | Kilian et al. |
| 2010/0019051 A1 | 1/2010 | Rosen |
| 2010/0025483 A1 | 2/2010 | Hoeynck et al. |
| 2010/0070084 A1 | 3/2010 | Steinberg et al. |
| 2010/0070085 A1 | 3/2010 | Harrod et al. |
| 2010/0070086 A1 | 3/2010 | Harrod et al. |
| 2010/0070089 A1 | 3/2010 | Harrod et al. |
| 2010/0070093 A1 | 3/2010 | Harrod et al. |
| 2010/0070234 A1 | 3/2010 | Steinberg et al. |
| 2010/0070907 A1 | 3/2010 | Harrod et al. |
| 2010/0084482 A1 | 4/2010 | Kennedy et al. |
| 2010/0119234 A1 | 5/2010 | Suematsu et al. |
| 2010/0167783 A1 | 7/2010 | Alameh et al. |
| 2010/0193592 A1 | 8/2010 | Simon et al. |
| 2010/0198425 A1 | 8/2010 | Donovan |
| 2010/0211224 A1 | 8/2010 | Keeling et al. |
| 2010/0262298 A1 | 10/2010 | Johnson et al. |
| 2010/0262299 A1 | 10/2010 | Cheung et al. |
| 2010/0280667 A1 | 11/2010 | Steinberg |
| 2010/0289643 A1 | 11/2010 | Trundle et al. |
| 2010/0308119 A1 | 12/2010 | Steinberg et al. |
| 2010/0318227 A1 | 12/2010 | Steinberg et al. |
| 2011/0015797 A1 | 1/2011 | Gilstrap |
| 2011/0046792 A1 | 2/2011 | Imes et al. |
| 2011/0046805 A1 | 2/2011 | Bedros et al. |
| 2011/0046806 A1 | 2/2011 | Nagel et al. |
| 2011/0077896 A1 | 3/2011 | Steinberg et al. |
| 2011/0102126 A1 | 5/2011 | Chung |
| 2011/0185895 A1 | 8/2011 | Freen |
| 2011/0253796 A1 | 10/2011 | Posa et al. |
| 2011/0307103 A1 | 12/2011 | Cheung et al. |
| 2012/0065935 A1 | 3/2012 | Steinberg et al. |
| 2012/0085831 A1 | 4/2012 | Kopp |
| 2012/0131504 A1 | 5/2012 | Fadell et al. |
| 2012/0158350 A1 | 6/2012 | Steinberg et al. |
| 2012/0221151 A1 | 8/2012 | Steinberg |
| 2013/0099124 A1 | 4/2013 | Filson et al. |

FOREIGN PATENT DOCUMENTS

| | | |
|---|---|---|
| EP | 196069 | 12/1991 |
| EP | 2769193 A1 | 8/2014 |
| GB | 2080001 A | 1/1982 |
| JP | 59106311 | 6/1984 |
| JP | 01252850 | 10/1989 |
| JP | 09298780 | 11/1997 |
| JP | 2005244362 A | 9/2005 |
| JP | 2006333117 A | 12/2006 |
| WO | 0248851 | 6/2002 |
| WO | 2007136290 A1 | 11/2007 |
| WO | 2007136292 A1 | 11/2007 |
| WO | 2010078459 | 6/2010 |
| WO | 2013058934 A1 | 4/2013 |

OTHER PUBLICATIONS

Braeburn 5300 Installer Guide, Braeburn Systems, LLC, Dec. 9, 2009, 10 pages.
Braeburn Model 5200, Braeburn Systems, LLC, Jul. 20, 2011, 11 pages.
Ecobee Smart Si Thermostat Installation Manual, Ecobee, Apr. 3, 2012, 40 pages.
Ecobee Smart Si Thermostat User Manual, Ecobee, Apr. 3, 2012, 44 pages.
Ecobee Smart Thermostat Installation Manual, Jun. 29, 2011, 20 pages.
Ecobee Smart Thermostat User Manual, May 11, 2010, 20 pages.
Electric Heat Lock Out on Heat Pumps, Washington State University Extension Energy Program, Apr. 2010, pp. 1-3.
Energy Joule, Ambient Devices, 2011, [retrieved on Aug. 1, 2012]. Retrieved from: http://web.archive.org/web/20110723210421/http://www.ambientdevices.com/products/energyjoule.html, 3 pages.
Honeywell Installation Guide FocusPRO TH6000 Series, Honeywell International, Inc., Jan. 5, 2012, 24 pages.
Honeywell Operating Manual FocusPRO TH6000 Series, Honeywell International, Inc., Mar. 25, 2011, 80 pages.
Honeywell Prestige IAQ Product Data 2, Honeywell International, Inc., Jan. 12, 2012, 126 pages.
Honeywell Prestige THX9321 and TXH9421 Product Data, Honeywell International, Inc., 68-0311, Jan. 2012, 126 pages.
Honeywell Prestige THX9321-9421 Operating Manual, Honeywell International, Inc., Jul. 6, 2011, 120 pages.
Hunter Internet Thermostat Installation Guide, Hunter Fan Co., Aug. 14, 2012, 8 pages.
ICY 3815TT-001 Timer-Thermostat Package Box, ICY BV Product Bar Code No. 8717953007902, 2009, 2 pages.
Introducing the New Smart Si Thermostat, Datasheet [online]. Ecobee, Mar. 2012 [retrieved on Feb. 25, 2013]. Retrieved from the Internet: <URL: https://www.ecobee.com/solutions/home/smart-si/ >, Mar. 12, 2012, 4 pages.
Lennox ComfortSense 5000 Owners Guide, Lennox Industries, Inc., Feb. 2008, 32 pages.
Lennox ComfortSense 7000 Owners Guide, Lennox Industries, Inc., May 2009, 15 pages.
Lennox iComfort Manual, Lennox Industries, Inc., Dec. 2010, 20 pages.
Lux PSPU732T Manual, LUX Products Corporation, Jan. 6, 2009, 48 pages.
NetX RP32-Wifi Network Thermostat Consumer Brochure, Network Thermostat, May 2011, 2 pages.
NetX RP32-Wifi Network Thermostat Specification Sheet, Network Thermostat, Feb. 28, 2012, 2 pages.
RobertShaw Product Manual 9620, Maple Chase Company, Jun. 12, 2001, 14 pages.
RobertShaw Product Manual 9825i2, Maple Chase Company, Jul. 17, 2006, 36 pages.
SYSTXCCUIZ01-V Infinity Control Installation Instructions, Carrier Corp, May 31, 2012, 20 pages.
T8611G Chronotherm IV Deluxe Programmable Heat Pump Thermostat Product Data, Honeywell International Inc., Oct. 1997, 24 pages.
TB-PAC, TB-PHP, Base Series Programmable Thermostats, Carrier Corp, May 14, 2012, 8 pages.
The Clever Thermostat, ICY BV Web Page, http://www.icy.nl/en/consumer/products/clever-thermostat, ICY BV, 2012, 1 page.
The Clever Thermostat User Manual and Installation Guide, ICY BV ICY3815 Timer-Thermostat, 2009, pp. 1-36.
The Perfect Climate Comfort Center PC8900A W8900A-C Product Data Sheet, Honeywell International Inc, Apr. 2001, 44 pages.
Trane Communicating Thermostats for Fan Coil, Trane, May 2011, 32 pages.
Trane Communicating Thermostats for Heat Pump Control, Trane, May 2011, 32 pages.
Trane Install XL600 Installation Manual, Trane, Mar. 2006, 16 pages.
Trane XL950 Installation Guide, Trane, Mar. 2011, 20 pages.
Venstar T2900 Manual, Venstar, Inc., Apr. 2008, 113 pages.
Venstar T5800 Manual, Venstar, Inc., Sep. 7, 2011, 63 pages.
VisionPRO TH8000 Series Installation Guide, Honeywell International, Inc., Jan. 2012, 12 pages.
VisionPRO TH8000 Series Operating Manual, Honeywell International, Inc., Mar. 2011, 96 pages.
VisionPRO Wi-Fi Programmable Thermostat, Honeywell International, Inc. Operating Manual, Aug. 2012, 48 pages.
White Rodgers (Emerson) Model 1F81-261 Installation and Operating Instructions, White Rodgers, Apr. 15, 2010, 8 pages.

(56) References Cited

OTHER PUBLICATIONS

White Rodgers (Emerson) Model IF98EZ-1621 Homeowner's User Guide, White Rodgers, Jan. 25, 2012, 28 pages.

Allen et al., "Real-Time Earthquake Detection and Hazard Assessment by ElarmS Across California", Geophysical Research Letters, vol. 36, L00B08, 2009, pp. 1-6.

Arens et al., "Demand Response Enabling Technology Development", Phase I Report: Jun. 2003-Nov. 2005, Jul. 27, P:/DemandRes/UC Papers/DR-Phase1Report-Final DraftApr. 24-26.doc, University of California Berkeley, pp. 1-108.

Arens et al., "New Thermostat Demand Response Enabling Technology", Poster, University of California Berkeley, Jun. 10, 2004.

Deleeuw, "Ecobee WiFi Enabled Smart Thermostat Part 2: The Features Review", Retrieved from <URL: http://www.homenetworkenabled.com/content.php?136-ecobee-WiFi-enabled-Smart-Thermostat-Part-2-The-Features-review>, Dec. 2, 2011, 5 pages.

Gao et al., "The Self-Programming Thermostat: Optimizing Setback Schedules Based on Home Occupancy Patterns", In Proceedings of the First ACM Workshop on Embedded Sensing Systems for Energy-Efficiency in Buildings, Nov. 3, 2009, 6 pages.

Loisos et al., "Buildings End-Use Energy Efficiency: Alternatives to Compressor Cooling", California Energy Commission, Public Interest Energy Research, Jan. 2000, 80 pages.

Lu et al., "The Smart Thermostat: Using Occupancy Sensors to Save Energy in Homes", In Proceedings of the 8th ACM Conference on Embedded Networked Sensor Systems, Nov. 3-5, 2010, pp. 211-224.

Mozer, "The Neural Network House: An Environmental that Adapts to it's Inhabitants", AAAI Technical Report SS-98-02, 1998, pp. 110-114.

International Patent Application No. PCT/US2012/056767, International Search Report and Written Opinion, mailed Dec. 6, 2012, 16 pages.

Salus, "S-Series Digital Thermostat Instruction Manual-ST620 Model No. Instruction Manual", www.salus-tech.com, Version 005, Apr. 29, 2010, 24 pages.

Ambient Devices Energy Joule, viewed Feb. 13, 2013, 2 pages. Accessed at: http://www.ambientdevices.com/products/energyjoule.html.

Arens, E., et al., "Demand Response Electrical Appliance Manager User Interface Design, Development and Testing," University of California Berkeley, 2005, 1 page.

Arens, E., et al., "Demand Response Enabled Thermostat Control Strategies and Interface," University of California Berkeley, 2004, 1 page.

Chinese Office Action issued on Dec. 31, 2014 for Chinese Patent Application No. 201280055644.X filed on Sep. 22, 2012, all pages.

European Office Action issued on Nov. 24, 2014 for European Patent Application No. 12841062.8 filed on Sep. 22, 2012, all pages.

US Office Action issued on Dec. 15, 2014 for U.S. Appl. No. 14/457,797, filed on Aug. 12, 2014, all pages.

US Office Action issued on Dec. 19, 2014 for U.S. Appl. No. 14/473,885, filed on Aug. 29, 2014, all pages.

International Search Report and Written Opinion mailed Dec. 6, 2012 for International Patent Application PCT/US2012/056767 filed Sep. 22, 2012, all pages.

International Preliminary Report on Patentability issued Apr. 22, 2014 for International Patent Application PCT/US2012/056767 filed Sep. 22, 2012, all pages.

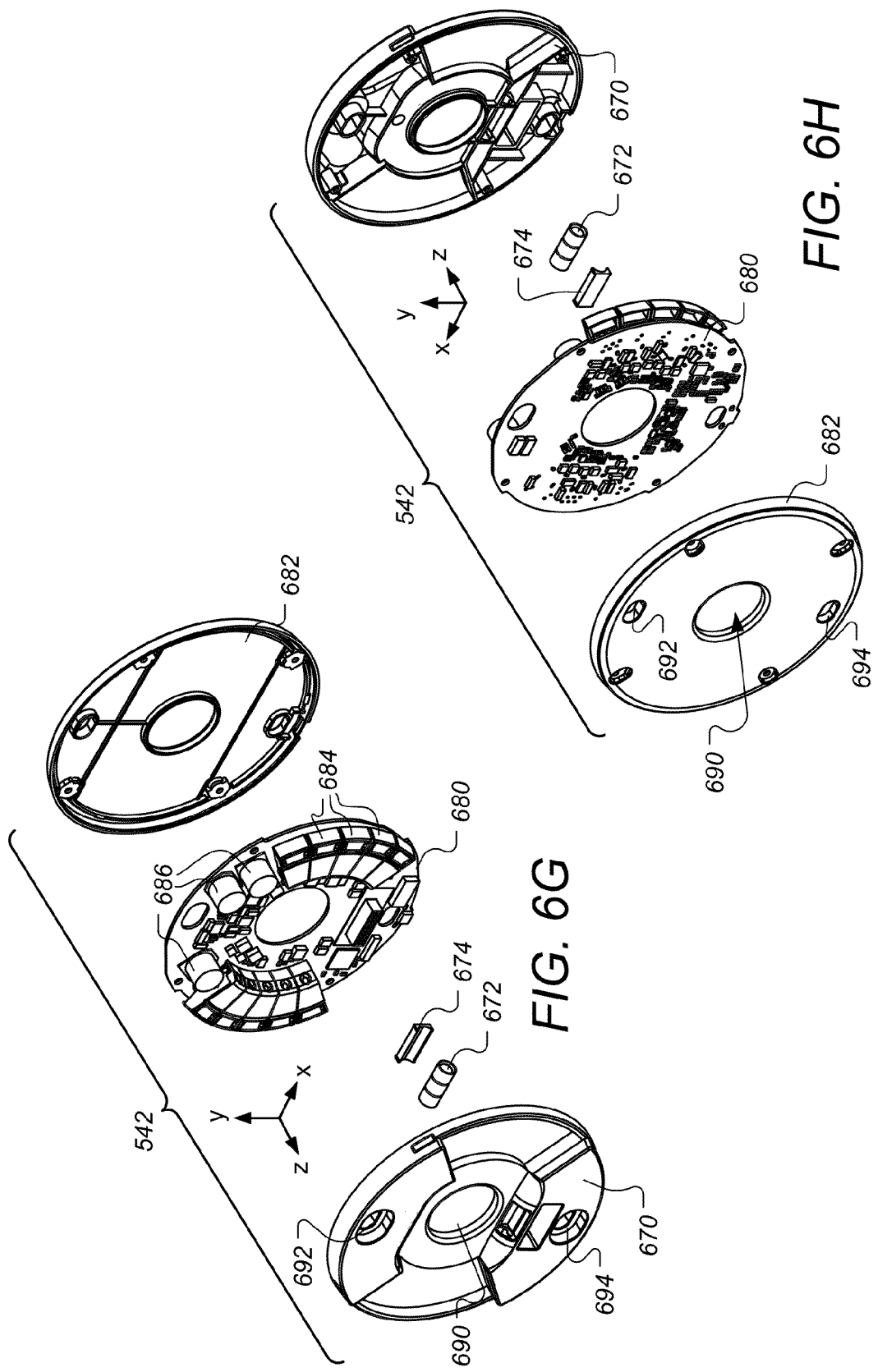

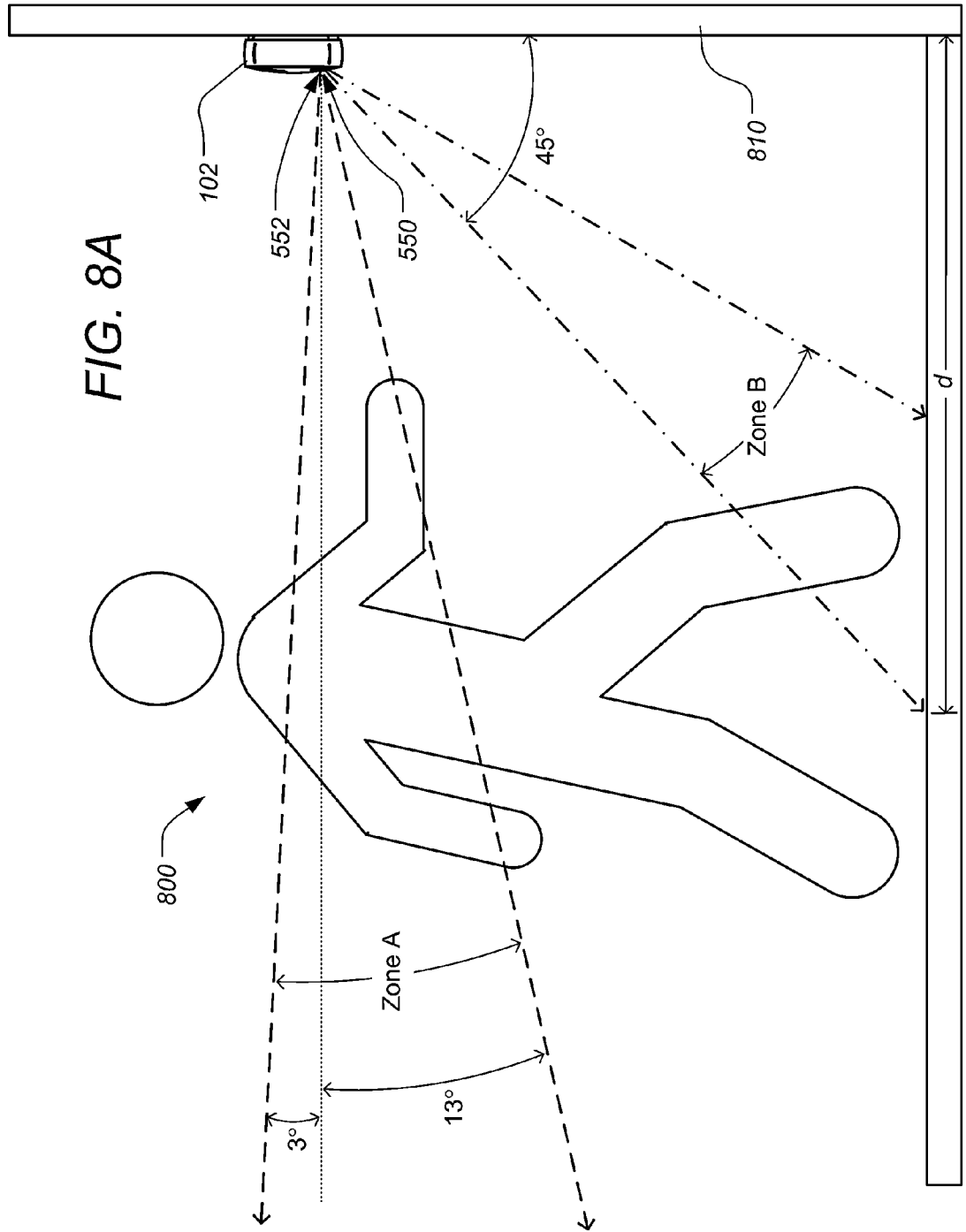

INTEGRATING SENSING SYSTEMS INTO THERMOSTAT HOUSING IN MANNERS FACILITATING COMPACT AND VISUALLY PLEASING PHYSICAL CHARACTERISTICS THEREOF

CROSS-REFERENCES TO RELATED APPLICATIONS

This application is a Continuation of U.S. patent application Ser. No. 14/038,270 filed Sep. 26, 2013, which is a Continuation of U.S. patent application Ser. No. 13/624,881 filed Sep. 21, 2012, which claims the benefit of the commonly assigned U.S. Prov. Ser. No. 61/627,996 filed Oct. 21, 2011. Each of these applications are incorporated by reference herein.

FIELD

This patent specification relates to systems, methods, and related computer program products for the monitoring and control of energy-consuming systems or other resource-consuming systems. More particularly, this patent specification relates to an occupancy sensing thermostat having an external housing with motion detection components integrated therewith.

BACKGROUND

In designing a wall-mounted thermostat, it is desirable to have a thermostat that has a visually pleasing, smooth, sleek and rounded exterior appearance while at the same time including one or more sensors for detecting occupancy and/or users. It is also desirable not to have visible front facing vents or grilles.

It is to be appreciated that although exemplary embodiments are presented herein for the particular context of HVAC system control, there are a wide variety of other resource usage contexts for which the embodiments are readily applicable including, but not limited to, water usage, air usage, the usage of other natural resources, and the usage of other (i.e., non-HVAC-related) forms of energy, as would be apparent to the skilled artisan in view of the present disclosure. Therefore, such application of the embodiments in such other resource usage contexts is not outside the scope of the present teachings.

SUMMARY

According to one embodiment, an occupancy sensing electronic thermostat may include a thermostat body, an electronic display that is viewable by a user in front of the thermostat, a passive infrared sensor for measuring infrared energy, and an infrared energy directing element formed integrally with a front surface of the thermostat body and extending across only a portion of the front surface of the thermostat body. In some embodiments, the passive infrared sensor may be positioned behind the infrared energy directing element such that infrared energy is directed thereonto by the infrared energy directing element. The thermostat may also include a first temperature sensor in thermal communication with the front surface of the thermostat body for making temperature measurements used for a calculating an ambient temperature. The thermostat may additionally include a second temperature sensor positioned within the thermostat body in a location closer than the first temperature sensor to one or more heat generating components within the thermostat body, where the calculation of ambient temperature is based at least in part on a comparison between measurements from the first and second temperature sensors. The thermostat may further include a microprocessor programmed to detect occupancy based at least in part on measurements made by the passive infrared sensor.

According to another embodiment, an occupancy sensing electronic thermostat may include a thermostat body, an electronic display that is viewable by a user in front of the thermostat, a passive infrared sensor for measuring infrared energy, and an infrared energy directing element formed integrally with a front surface of the thermostat body and extending across only a portion of the front surface of the thermostat body. In some embodiments, the passive infrared sensor may be positioned behind the infrared energy directing element such that infrared energy is directed thereonto by the infrared energy directing element. The thermostat may also include a microprocessor programmed to detect occupancy based at least in part on measurements made by the passive infrared sensor. The thermostat may additionally include a second passive infrared sensor for measuring infrared energy, where the infrared energy directing element is shaped and the second passive infrared sensor is positioned such that it is provided with a substantially downwardly directed field of view when the thermostat is wall mounted, and the microprocessor is programmed to detect an approaching user that will likely directly interact with the thermostat based at least in part on the measurements made by the second passive infrared sensor.

According to another embodiment, an occupancy sensing electronic thermostat may include a thermostat body, an electronic display that is viewable by a user in front of the thermostat, a passive infrared sensor for measuring infrared energy, and an infrared energy directing element formed integrally with a front surface of the thermostat body and extending across only a portion of the front surface of the thermostat body. In some embodiments, the passive infrared sensor may be positioned behind the infrared energy directing element such that infrared energy is directed thereonto by the infrared energy directing element. The thermostat may also include a microprocessor programmed to detect occupancy based at least in part on measurements made by the passive infrared sensor. The thermostat may additionally include a second passive infrared sensor for measuring infrared energy. The infrared energy directing element may be shaped and the second passive infrared sensor may be positioned such that it is provided with a substantially downwardly directed field of view when the thermostat is wall mounted, and the microprocessor may be further programmed to detect an approaching user that will likely directly interact with the thermostat based at least in part on the measurements made by the second passive infrared sensor.

According to another embodiment, an occupancy sensing electronic thermostat may include a thermostat body, an electronic display that is viewable by a user in front of the thermostat, a passive infrared sensor for measuring infrared energy, and an infrared energy directing element formed integrally with a front surface of the thermostat body and extending across only a portion of the front surface of the thermostat body. In some embodiments, the passive infrared sensor may be positioned behind the infrared energy directing element such that infrared energy is directed thereonto by the infrared energy directing element. The thermostat may also include one or more energy consuming thermostat components that have active and inactive states, the one or more components consuming less energy in the inactive states than in the active states, where the transition from inactive to active states is based at least in part on measurements from the passive infrared sensor.

It will be appreciated that these systems and methods are novel, as are applications thereof and many of the components, systems, methods and algorithms employed and included therein. It should be appreciated that embodiments of the presently described inventive body of work can be implemented in numerous ways, including as processes, apparata, systems, devices, methods, computer readable media, computational algorithms, embedded or distributed software and/or as a combination thereof. Several illustrative embodiments are described below.

BRIEF DESCRIPTION OF THE DRAWINGS

The inventive body of work will be readily understood by referring to the following detailed description in conjunction with the accompanying drawings, in which:

FIGS. 6G-6H illustrate exploded front and rear perspective views, respectively, of the back plate unit with respect to its primary components, according to some embodiments;

FIGS. 8A-8B are diagrams illustrating considerations in designing forward looking and downward looking passive infrared sensor fields of view, according to some embodiments;

DETAILED DESCRIPTION

Figure 1:
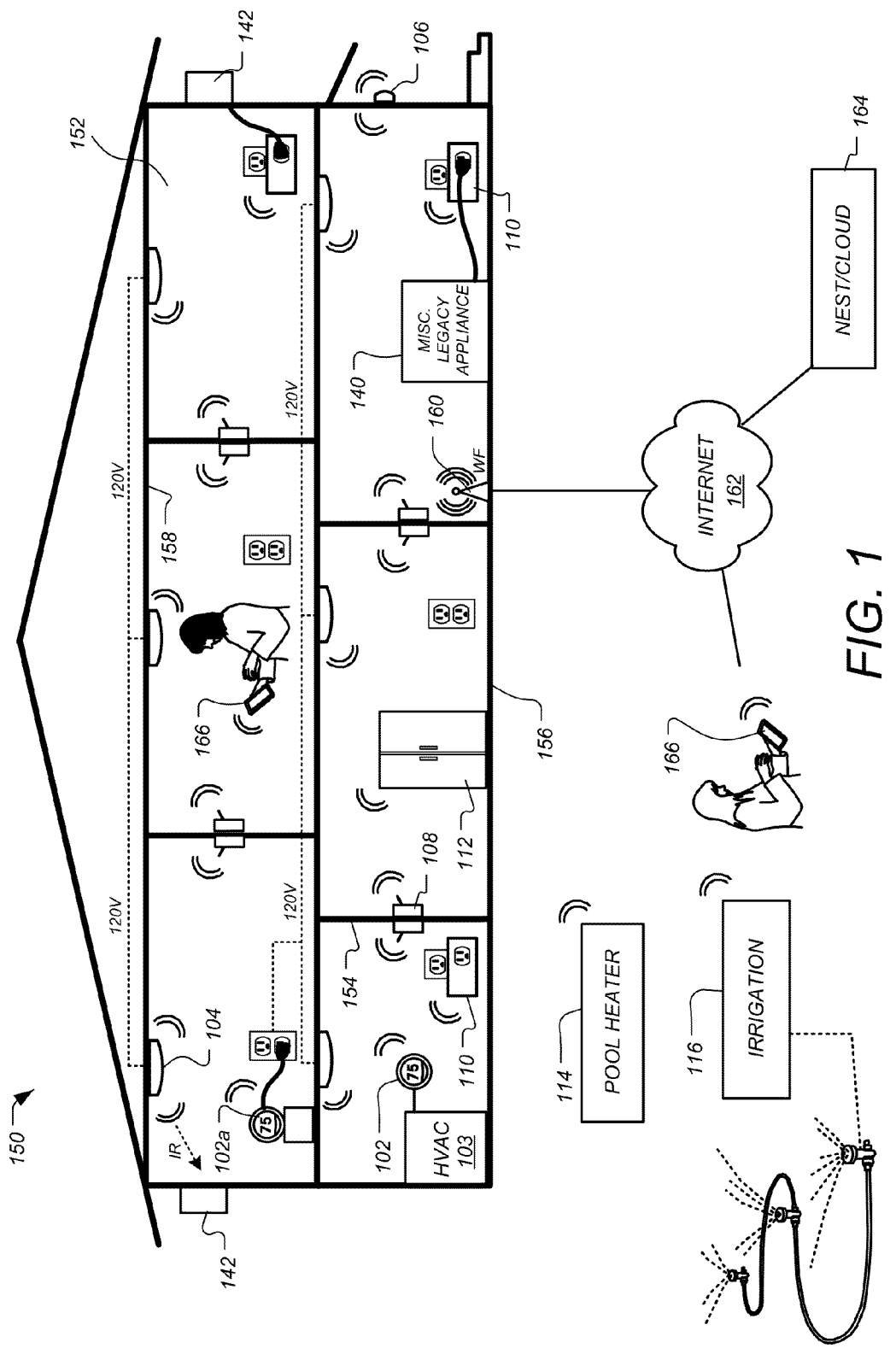
FIG. 1 illustrates an example of a smart home environment within which one or more of the devices, methods, systems, services, and/or computer program products described further herein can be applicable.

The subject matter of this patent specification relates to the subject matter of the following commonly assigned applications, each of which is incorporated by reference herein: U.S. Ser. No. 13/199,108 filed Aug. 17, 2011; U.S. Ser. No. 13/466,026 filed May 7, 2012; and International Application Ser. No. PCT/US12/00007 filed Jan. 3, 2012. The subject matter of this patent specification further relates to the subject matter of the commonly assigned U.S. Ser. No. 13/624,811 (entitled "Thermostat With Ring-Shaped Control Member" filed even date herewith, which is incorporated by reference herein. The subject matter of this patent specification further relates to the subject matter of the commonly assigned U.S. Ser. No. 13/624,878 (entitled "Thermostat With Wiring Terminals Configured for Spatial Compactness and Ease of Wire Installation" filed even date herewith, which is incorporated by reference herein. The above-referenced patent applications are collectively referenced herein as "the commonly assigned incorporated applications."

A detailed description of the inventive body of work is provided herein. While several embodiments are described, it should be understood that the inventive body of work is not limited to any one embodiment, but instead encompasses numerous alternatives, modifications, and equivalents. In addition, while numerous specific details are set forth in the following description in order to provide a thorough understanding of the inventive body of work, some embodiments can be practiced without some or all of these details. Moreover, for the purpose of clarity, certain technical material that is known in the related art has not been described in detail in order to avoid unnecessarily obscuring the inventive body of work.

As used herein the term "HVAC" includes systems providing both heating and cooling, heating only, cooling only, as well as systems that provide other occupant comfort and/or conditioning functionality such as humidification, dehumidification and ventilation.

As used herein the terms power "harvesting," "sharing" and "stealing" when referring to HVAC thermostats all refer to thermostats that are designed to derive power from the power transformer through the equipment load without using a direct or common wire source directly from the transformer.

As used herein the term "residential" when referring to an HVAC system means a type of HVAC system that is suitable to heat, cool and/or otherwise condition the interior of a building that is primarily used as a single family dwelling. An example of a cooling system that would be considered residential would have a cooling capacity of less than about 5 tons of refrigeration (1 ton of refrigeration=12,000 Btu/h).

As used herein the term "light commercial" when referring to an HVAC system means a type of HVAC system that is suitable to heat, cool and/or otherwise condition the interior of a building that is primarily used for commercial purposes, but is of a size and construction that a residential HVAC system is considered suitable. An example of a cooling system that would be considered residential would have a cooling capacity of less than about 5 tons of refrigeration.

As used herein the term "thermostat" means a device or system for regulating parameters such as temperature and/or humidity within at least a part of an enclosure. The term "thermostat" may include a control unit for a heating and/or cooling system or a component part of a heater or air conditioner. As used herein the term "thermostat" can also refer generally to a versatile sensing and control unit (VSCU unit) that is configured and adapted to provide sophisticated, customized, energy-saving HVAC control functionality while at the same time being visually appealing, non-intimidating, elegant to behold, and delightfully easy to use.

FIG. 1 illustrates an example of a smart home environment within which one or more of the devices, methods, systems, services, and/or computer program products described further herein can be applicable. The depicted smart home environment includes a structure 150, which can include, e.g., a house, office building, garage, or mobile home. It will be appreciated that devices can also be integrated into a smart home environment that does not include an entire structure 150, such as an apartment, condominium, or office space. Further, the smart home environment can control and/or be coupled to devices outside of the actual structure 150. Indeed, several devices in the smart home environment need not physically be within the structure 150 at all. For example, a device controlling a pool heater or irrigation system can be located outside of the structure 150.

The depicted structure 150 includes a plurality of rooms 152, separated at least partly from each other via walls 154. The walls 154 can include interior walls or exterior walls. Each room can further include a floor 156 and a ceiling 158. Devices can be mounted on, integrated with and/or supported by a wall 154, floor or ceiling.

The smart home depicted in FIG. 1 includes a plurality of devices, including intelligent, multi-sensing, network-connected devices that can integrate seamlessly with each other and/or with cloud-based server systems to provide any of a variety of useful smart home objectives. One, more or each of the devices illustrated in the smart home environment and/or in the figure can include one or more sensors, a user interface, a power supply, a communications component, a modularity unit and intelligent software as described herein. Examples of devices are shown in FIG. 1.

An intelligent, multi-sensing, network-connected thermostat 102 can detect ambient climate characteristics (e.g., temperature and/or humidity) and control a heating, ventilation and air-conditioning (HVAC) system 103. One or more intelligent, network-connected, multi-sensing hazard detection units 104 can detect the presence of a hazardous substance and/or a hazardous condition in the home environment (e.g., smoke, fire, or carbon monoxide). One or more intelligent, multi-sensing, network-connected entryway interface devices 106, which can be termed a "smart doorbell", can detect a person's approach to or departure from a location, control audible functionality, announce a person's approach or departure via audio or visual means, or control settings on a security system (e.g., to activate or deactivate the security system).

Each of a plurality of intelligent, multi-sensing, network-connected wall light switches 108 can detect ambient lighting conditions, detect room-occupancy states and control a power and/or dim state of one or more lights. In some instances, light switches 108 can further or alternatively control a power state or speed of a fan, such as a ceiling fan. Each of a plurality of intelligent, multi-sensing, network-connected wall plug interfaces 110 can detect occupancy of a room or enclosure and control supply of power to one or more wall plugs (e.g., such that power is not supplied to the plug if nobody is at home). The smart home may further include a plurality of intelligent, multi-sensing, network-connected appliances 112, such as refrigerators, stoves and/or ovens, televisions, washers, dryers, lights (inside and/or outside the structure 150), stereos, intercom systems, garage-door openers, floor fans, ceiling fans, whole-house fans, wall air conditioners, pool heaters 114, irrigation systems 116, security systems (including security system components such as cameras, motion detectors and window/door sensors), and so forth. While descriptions of FIG. 1 can identify specific sensors and functionalities associated with specific devices, it will be appreciated that any of a variety of sensors and functionalities (such as those described throughout the specification) can be integrated into the device.

In addition to containing processing and sensing capabilities, each of the devices 102, 104, 106, 108, 110, 112, 114 and 116 can be capable of data communications and information sharing with any other of the devices 102, 104, 106, 108, 110, 112, 114 and 116, as well as to any cloud server or any other device that is network-connected anywhere in the world. The devices can send and receive communications via any of a variety of custom or standard wireless protocols (Wi-Fi, ZigBee, 6LoWPAN, etc.) and/or any of a variety of custom or standard wired protocols (CAT6 Ethernet, HomePlug, etc.). The wall plug interfaces 110 can serve as wireless or wired repeaters, and/or can function as bridges between (i) devices plugged into AC outlets and communicating using Homeplug or other power line protocol, and (ii) devices that not plugged into AC outlets.

For example, a first device can communicate with a second device via a wireless router 160. A device can further communicate with remote devices via a connection to a network, such as the Internet 162. Through the Internet 162, the device can communicate with a central server or a cloud-computing system 164. The central server or cloud-computing system 164 can be associated with a manufacturer, support entity or service provider associated with the device. For one embodiment, a user may be able to contact customer support using a device itself rather than needing to use other communication means such as a telephone or Internet-connected computer. Further, software updates can be automatically sent from the central server or cloud-computing system 164 to devices (e.g., when available, when purchased, or at routine intervals).

By virtue of network connectivity, one or more of the smart-home devices of FIG. 1 can further allow a user to interact with the device even if the user is not proximate to the device. For example, a user can communicate with a device using a computer (e.g., a desktop computer, laptop computer, or tablet) or other portable electronic device (e.g., a smartphone). A webpage or app can be configured to receive communications from the user and control the device based on the communications and/or to present information about the device's operation to the user. For example, the user can view a current setpoint temperature for a device and adjust it using a computer. The user can be in the structure during this remote communication or outside the structure.

The smart home also can include a variety of non-communicating legacy appliances 140, such as old conventional washer/dryers, refrigerators, and the like which can be controlled, albeit coarsely (ON/OFF), by virtue of the wall plug interfaces 110. The smart home can further include a variety of partially communicating legacy appliances 142, such as IR-controlled wall air conditioners or other IR-controlled devices, which can be controlled by IR signals provided by the hazard detection units 104 or the light switches 108.

Figure 2:
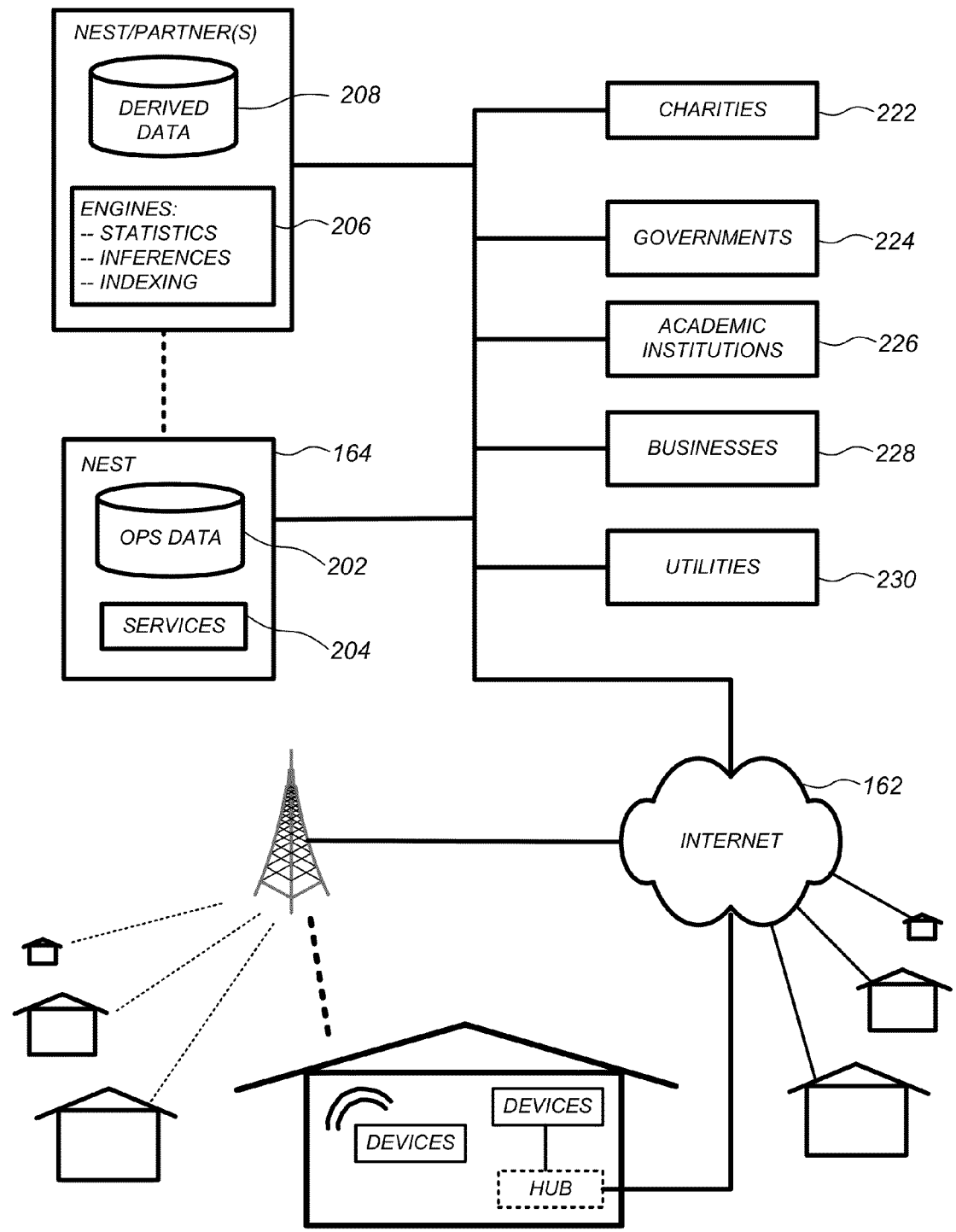
FIG. 2 illustrates a network-level view of an extensible devices and services platform with which the smart home of FIG. 1 can be integrated, according to some embodiments.

FIG. 2 illustrates a network-level view of an extensible devices and services platform with which the smart home of FIG. 1 can be integrated, according to some embodiments. Each of the intelligent, network-connected devices from FIG. 1 can communicate with one or more remote central servers or cloud computing systems 164. The communication can be enabled by establishing connection to the Internet 162 either directly (for example, using 3G/4G connectivity to a wireless carrier), though a hubbed network (which can be scheme ranging from a simple wireless router, for example, up to and including an intelligent, dedicated whole-home control node), or through any combination thereof.

The central server or cloud-computing system 164 can collect operation data 202 from the smart home devices. For example, the devices can routinely transmit operation data or can transmit operation data in specific instances (e.g., when requesting customer support). The central server or cloud-computing architecture 164 can further provide one or more services 204. The services 204 can include, e.g., software update, customer support, sensor data collection/logging, remote access, remote or distributed control, or use suggestions (e.g., based on collected operation data 204 to improve performance, reduce utility cost, etc.). Data associated with the services 204 can be stored at the central server or cloud-computing system 164 and the central server or cloud-computing system 164 can retrieve and transmit the data at an appropriate time (e.g., at regular intervals, upon receiving request from a user, etc.).

One salient feature of the described extensible devices and services platform, as illustrated in FIG. 2, is a processing engines 206, which can be concentrated at a single server or distributed among several different computing entities without limitation. Processing engines 206 can include engines configured to receive data from a set of devices (e.g., via the Internet or a hubbed network), to index the data, to analyze the data and/or to generate statistics based on the analysis or as part of the analysis. The analyzed data can be stored as derived data 208. Results of the analysis or statistics can thereafter be transmitted back to a device providing ops data used to derive the results, to other devices, to a server providing a webpage to a user of the device, or to other non-device entities. For example, use statistics, use statistics relative to use of other devices, use patterns, and/or statistics summarizing sensor readings can be transmitted. The results or statistics can be provided via the Internet 162. In this manner, processing engines 206 can be configured and programmed to derive a variety of useful information from the operational data obtained from the smart home. A single server can include one or more engines.

The derived data can be highly beneficial at a variety of different granularities for a variety of useful purposes, ranging from explicit programmed control of the devices on a per-home, per-neighborhood, or per-region basis (for example, demand-response programs for electrical utilities), to the generation of inferential abstractions that can assist on a per-home basis (for example, an inference can be drawn that the homeowner has left for vacation and so security detection equipment can be put on heightened sensitivity), to the generation of statistics and associated inferential abstractions that can be used for government or charitable purposes. For example, processing engines 206 can generate statistics about device usage across a population of devices and send the statistics to device users, service providers or other entities (e.g., that have requested or may have provided monetary compensation for the statistics). As specific illustrations, statistics can be transmitted to charities 222, governmental entities 224 (e.g., the Food and Drug Administration or the Environmental Protection Agency), academic institutions 226 (e.g., university researchers), businesses 228 (e.g., providing device warranties or service to related equipment), or utility companies 230. These entities can use the data to form programs to reduce energy usage, to preemptively service faulty equipment, to prepare for high service demands, to track past service performance, etc., or to perform any of a variety of beneficial functions or tasks now known or hereinafter developed.

Figure 3:
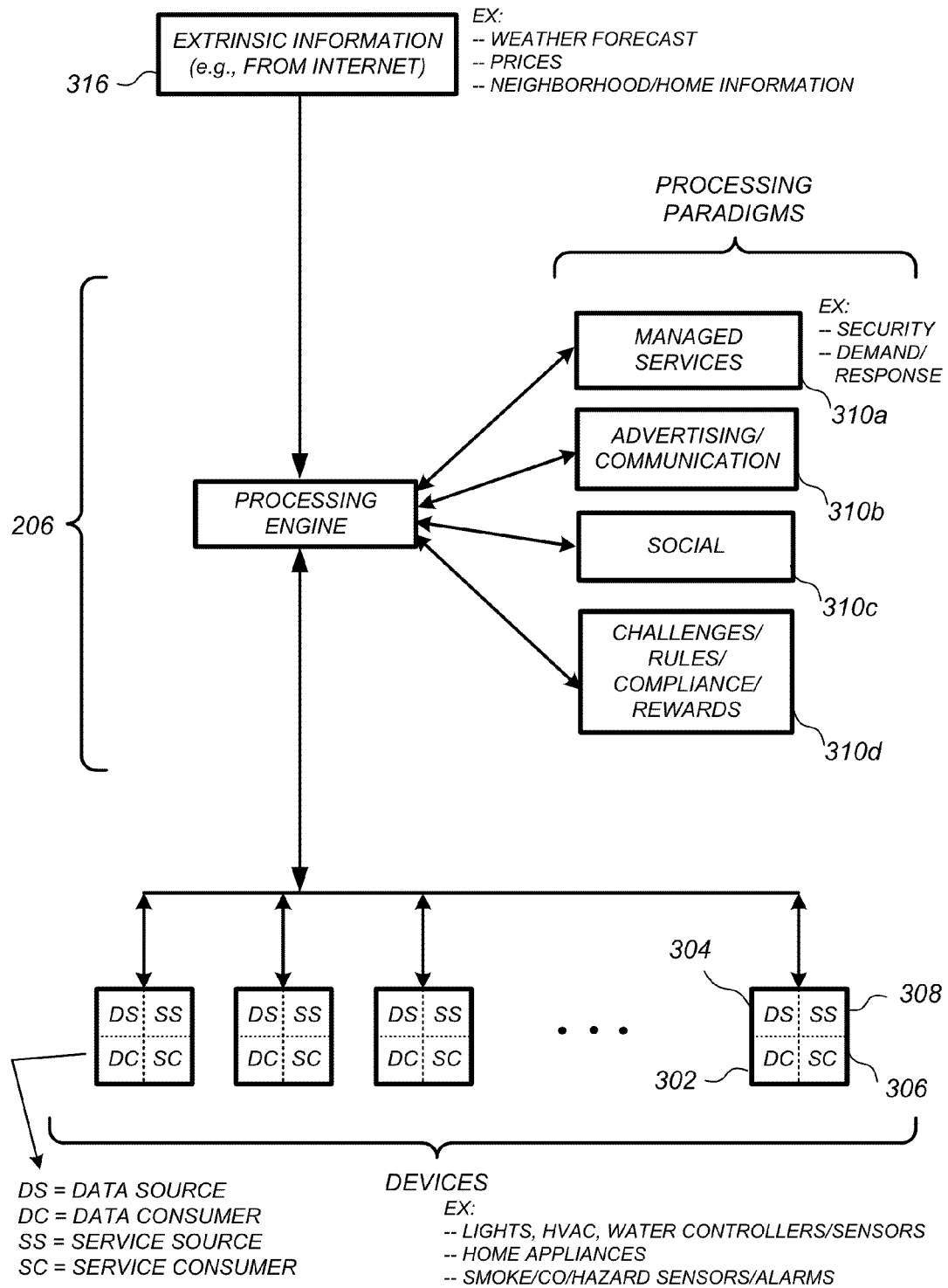
FIG. 3 illustrates an abstracted functional view of the extensible devices and services platform of FIG. 2, according to some embodiments.

FIG. 3 illustrates an abstracted functional view of the extensible devices and services platform of FIG. 2, with particular reference to the processing engine 206 as well as the devices of the smart home. Even though the devices situated in the smart home will have an endless variety of different individual capabilities and limitations, they can all be thought of as sharing common characteristics in that each of them is a data consumer 302 (DC), a data source 304 (DS), a services consumer 306 (SC), and a services source 308 (SS). Advantageously, in addition to providing the essential control information needed for the devices to achieve their local and immediate objectives, the extensible devices and services platform can also be configured to harness the large amount of data that is flowing out of these devices. In addition to enhancing or optimizing the actual operation of the devices themselves with respect to their immediate functions, the extensible devices and services platform can also be directed to "repurposing" that data in a variety of automated, extensible, flexible, and/or scalable ways to achieve a variety of useful objectives. These objectives may be predefined or adaptively identified based on, e.g., usage patterns, device efficiency, and/or user input (e.g., requesting specific functionality).

For example, FIG. 3 shows processing engine 206 as including a number of paradigms 310. Processing engine 206 can include a managed services paradigm 310a that monitors and manages primary or secondary device functions. The device functions can include ensuring proper operation of a device given user inputs, estimating that (e.g., and responding to) an intruder is or is attempting to be in a dwelling, detecting a failure of equipment coupled to the device (e.g., a light bulb having burned out), implementing or otherwise responding to energy demand response events, or alerting a user of a current or predicted future event or characteristic. Processing engine 206 can further include an advertising/communication paradigm 310b that estimates characteristics (e.g., demographic information), desires and/or products of interest of a user based on device usage. Services, promotions, products or upgrades can then be offered or automatically provided to the user. Processing engine 206 can further include a social paradigm 310c that uses information from a social network, provides information to a social network (for example, based on device usage), processes data associated with user and/or device interactions with the social network platform. For example, a user's status as reported to their trusted contacts on the social network could be updated to indicate when they are home based on light detection, security system inactivation or device usage detectors. As another example, a user may be able to share device-usage statistics with other users. Processing engine 206 can include a challenges/rules/compliance/rewards paradigm 310d that informs a user of challenges, rules, compliance regulations and/or rewards and/or that uses operation data to determine whether a challenge has been met, a rule or regulation has been complied with and/or a reward has been earned. The challenges, rules or regulations can relate to efforts to conserve energy, to live safely (e.g., reducing exposure to toxins or carcinogens), to conserve money and/or equipment life, to improve health, etc.

Processing engine can integrate or otherwise utilize extrinsic information 316 from extrinsic sources to improve the functioning of one or more processing paradigms. Extrinsic information 316 can be used to interpret operational data received from a device, to determine a characteristic of the environment near the device (e.g., outside a structure that the device is enclosed in), to determine services or products available to the user, to identify a social network or social-network information, to determine contact information of entities (e.g., public-service entities such as an emergency-response team, the police or a hospital) near the device, etc., to identify statistical or environmental conditions, trends or other information associated with a home or neighborhood, and so forth.

An extraordinary range and variety of benefits can be brought about by, and fit within the scope of, the described extensible devices and services platform, ranging from the ordinary to the profound. Thus, in one "ordinary" example, each bedroom of the smart home can be provided with a smoke/fire/CO alarm that includes an occupancy sensor, wherein the occupancy sensor is also capable of inferring (e.g., by virtue of motion detection, facial recognition, audible sound patterns, etc.) whether the occupant is asleep or awake. If a serious fire event is sensed, the remote security/monitoring service or fire department is advised of how many occupants there are in each bedroom, and whether those occupants are still asleep (or immobile) or whether they have properly evacuated the bedroom. While this is, of course, a very advantageous capability accommodated by the described extensible devices and services platform, there can be substantially more "profound" examples that can truly illustrate the potential of a larger "intelligence" that can be made available. By way of perhaps a more "profound" example, the same data bedroom occupancy data that is being used for fire safety can also be "repurposed" by the processing engine 206 in the context of a social paradigm of neighborhood child development and education. Thus, for example, the same bedroom occupancy and motion data discussed in the "ordinary" example can be collected and made available for processing (properly anonymized) in which the sleep patterns of schoolchildren in a particular ZIP code can be identified and tracked. Localized variations in the sleeping patterns of the schoolchildren may be identified and correlated, for example, to different nutrition programs in local schools.

Figure 4:
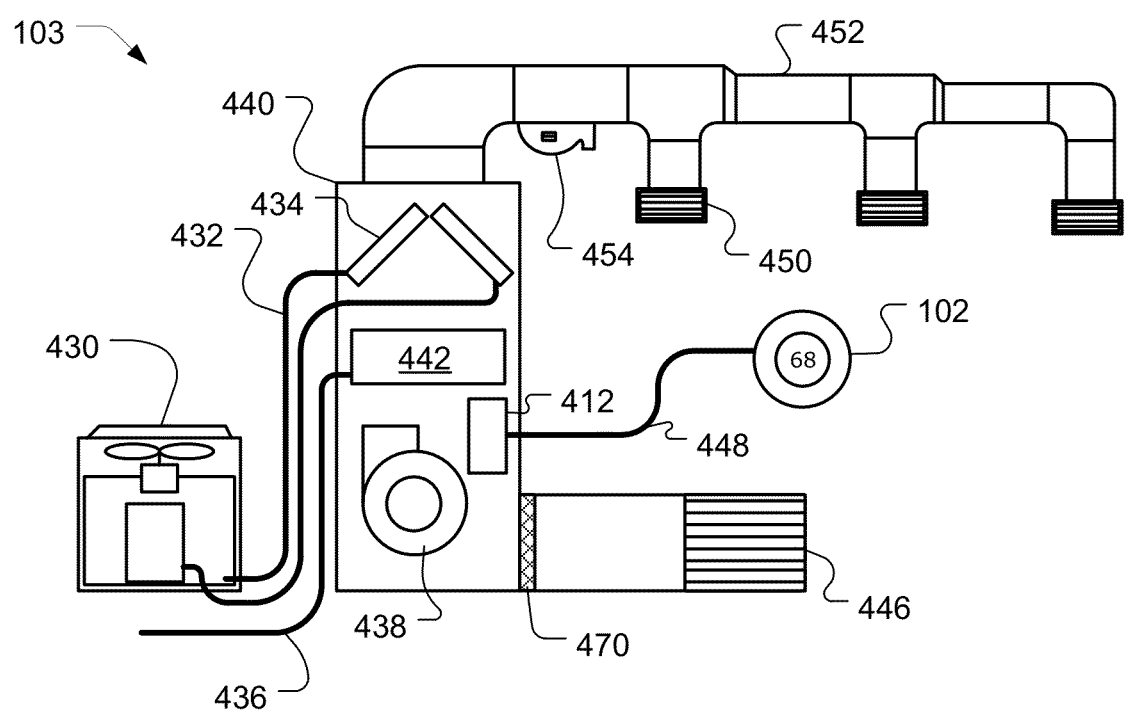
FIG. 4 is a schematic diagram of an HVAC system, according to some embodiments.

FIG. 4 is a schematic diagram of an HVAC system, according to some embodiments. HVAC system 103 provides heating, cooling, ventilation, and/or air handling for an enclosure, such as structure 150 depicted in FIG. 1. System 103 depicts a forced air type heating and cooling system, although according to other embodiments, other types of HVAC systems could be used such as radiant heat based systems, heat-pump based systems, and others.

For carrying out the heating function, heating coils or elements 442 within air handler 440 provide a source of heat using electricity or gas via line 436. Cool air is drawn from the enclosure via return air duct 446 through filter 470, using fan 438 and is heated through heating coils or elements 442. The heated air flows back into the enclosure at one or more locations via supply air duct system 452 and supply air registers such as register 450. In cooling, an outside compressor 430 passes a gas such as Freon through a set of heat exchanger coils and then through an expansion valve. The gas then goes through line 432 to the cooling coils or evaporator coils 434 in the air handler 440 where it expands, cools and cools the air being circulated via fan 438. A humidifier 454 may optionally be included in various embodiments that returns moisture to the air before it passes through duct system 452. Although not shown in FIG. 4, alternate embodiments of HVAC system 103 may have other functionality such as venting air to and from the outside, one or more dampers to control airflow within the duct system 452 and an emergency heating unit. Overall operation of HVAC system 103 is selectively actuated by control electronics 412 communicating with thermostat 102 over control wires 448.

Figure 5A:
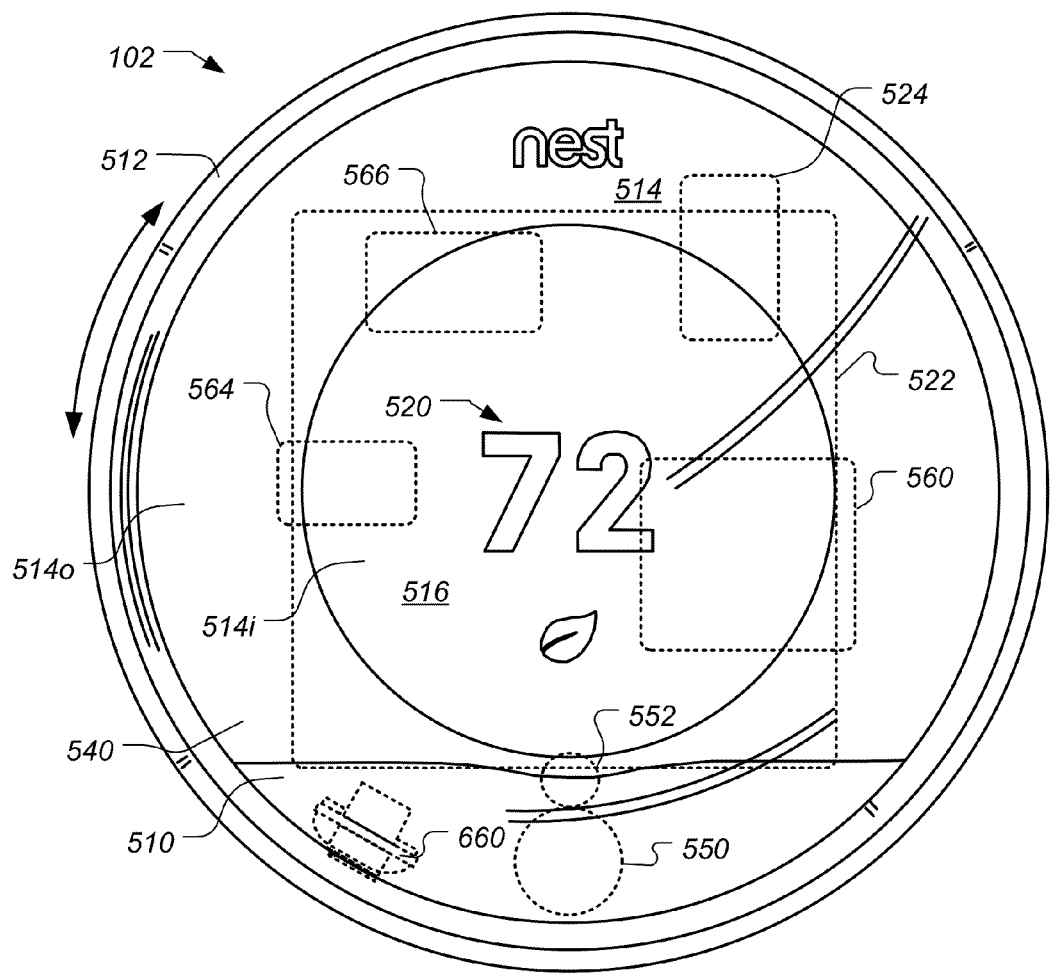
FIGS. 5A-5D illustrate a thermostat having a visually pleasing, smooth, sleek and rounded exterior appearance while at the same time including one or more sensors for detecting occupancy and/or users, according to some embodiments.
Figure 5B:
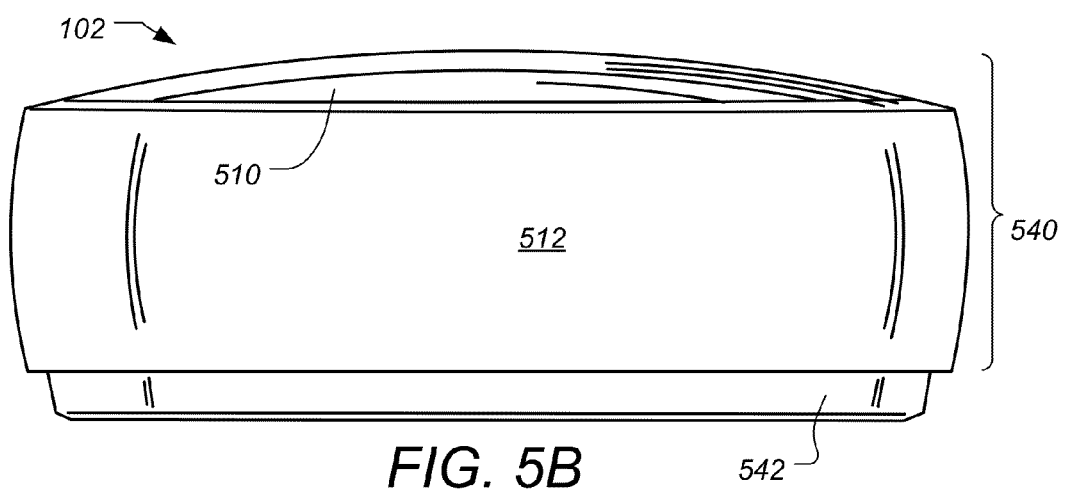
Figure 5C:
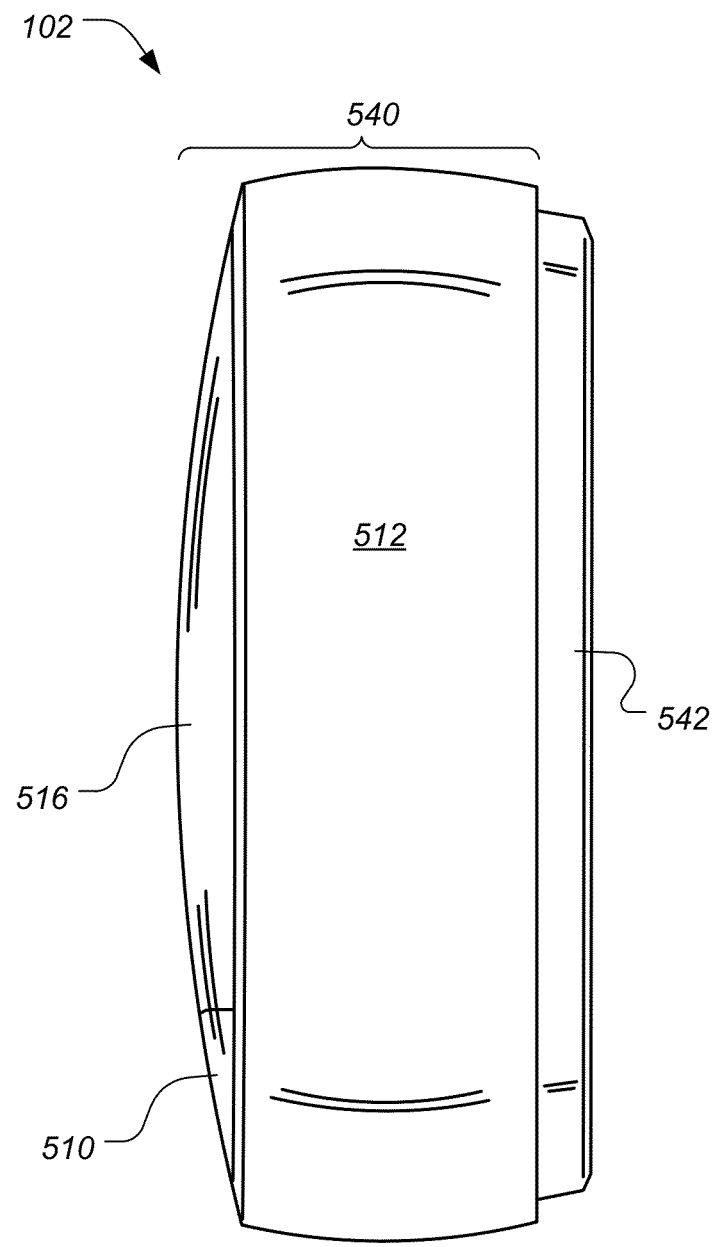
Figure 5D:
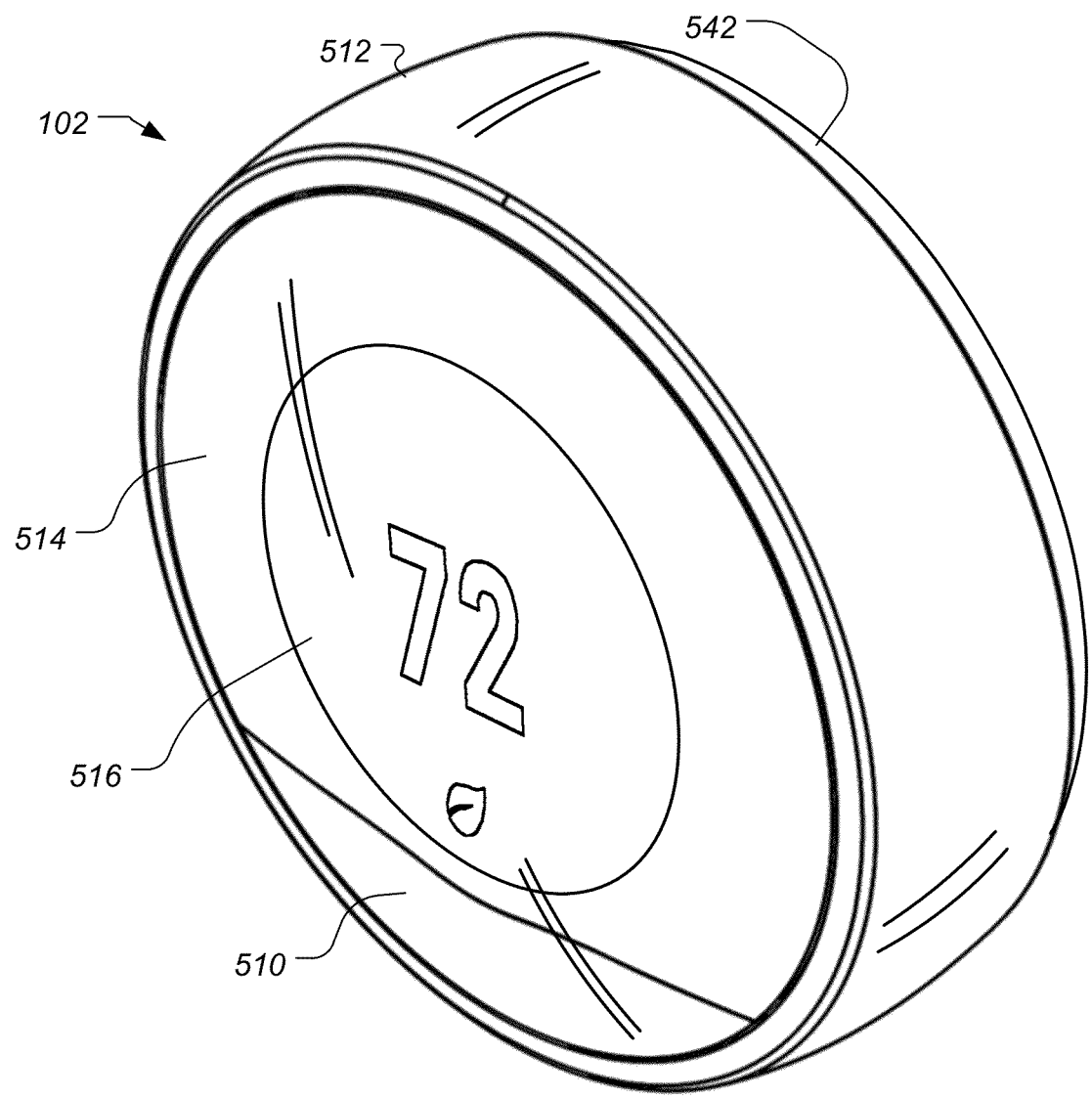

FIGS. 5A-5D illustrate a thermostat having a visually pleasing, smooth, sleek and rounded exterior appearance while at the same time including one or more sensors for detecting occupancy and/or users, according to some embodiments. FIG. 5A is front view, FIG. 5B is a bottom elevation, FIG. 5C is a right side elevation, and FIG. 5D is prospective view of thermostat 102. Unlike many prior art thermostats, thermostat 102 has a sleek, simple, uncluttered and elegant design that does not detract from home decoration, and indeed can serve as a visually pleasing centerpiece for the immediate location in which it is installed. Moreover, user interaction with thermostat 102 is facilitated and greatly enhanced over known conventional thermostats by the design of thermostat 102. The thermostat 102 includes control circuitry and is electrically connected to an HVAC system 103, such as is shown in FIGS. 1-4. Thermostat 102 is wall mountable, is circular in shape, and has an outer rotatable ring 512 for receiving user input. Thermostat 102 is circular in shape in that it appears as a generally disk-like circular object when mounted on the wall. Thermostat 102 has a large convex rounded front face lying inside the outer ring 512. According to some embodiments, thermostat 102 is approximately 80 mm in diameter and protrudes from the wall, when wall mounted, by 32 mm. The outer rotatable ring 512 allows the user to make adjustments, such as selecting a new setpoint temperature. For example, by rotating the outer ring 512 clockwise, the realtime (i.e. currently active) setpoint temperature can be increased, and by rotating the outer ring 512 counter-clockwise, the realtime setpoint temperature can be decreased. The front face of the thermostat 102 comprises a clear cover 514 that according to some embodiments is polycarbonate, and a Fresnel lens 510 having an outer shape that matches the contours of the curved outer front face of the thermostat 102. According to some embodiments, the Fresnel lens elements are formed on the interior surface of the Fresnel lens piece 510 such that they are not obviously visible by viewing the exterior of the thermostat 102. Behind the Fresnel lens is a passive infrared sensor 550 for detecting occupancy, and the Fresnel lens piece 510 is made from a high-density polyethylene (HDPE) that has an infrared transmission range appropriate for sensitivity to human bodies. As shown in FIGS. 5A-5D, the front edge of rotating ring 512, front face 514 and Fresnel lens 510 are shaped such that they together form a, integrated convex rounded front face that has a common outward arc or spherical shape gently arcing outward.

Although being formed from a single lens-like piece of material such as polycarbonate, the cover 514 has two different regions or portions including an outer portion 514o and a central portion 514i. According to some embodiments, the cover 514 is painted or smoked around the outer portion 514o, but leaves the central portion 514i visibly clear so as to facilitate viewing of an electronic display 516 disposed thereunderneath. According to some embodiments, the curved cover 514 acts as a lens that tends to magnify the information being displayed in electronic display 516 to users. According to some embodiments the central electronic display 516 is a dot-matrix layout (i.e. individually addressable) such that arbitrary shapes can be generated, rather than being a segmented layout. According to some embodiments, a combination of dot-matrix layout and segmented layout is employed. According to some embodiments, central display 516 is a backlit color liquid crystal display (LCD). An example of information displayed on the electronic display 516 is illustrated in FIG. 5A, and includes central numerals 520 that are representative of a current setpoint temperature. The thermostat 102 is preferably constructed such that the electronic display 516 is at a fixed orientation and does not rotate with the outer ring 512, so that the electronic display 516 remains easily read by the user. For some embodiments, the cover 514 and Fresnel lens 510 also remain at a fixed orientation and do not rotate with the outer ring 512. According to one embodiment in which the diameter of the thermostat 102 is about 80 mm, the diameter of the electronic display 516 is about 45 mm. According to some embodiments the gently outwardly curved shape of the front surface of thermostat 102, which is made up of cover 514, Fresnel lens 510 and the front facing portion of ring 512, is spherical, and matches a sphere having a radius of between 100 mm and 150 mm. According to some embodiments, the radius of the spherical shape of the thermostat front is about 136 mm.

Motion sensing with PIR sensor 550 as well as other techniques can be used in the detection and/or predict of occupancy, as is described further in the commonly assigned U.S. Ser. No. 12/881,430, which is incorporated herein by reference. According to some embodiments, occupancy information is used in generating an effective and efficient scheduled program. A second downwardly-tilted PIR sensor 552 is provided to detect an approaching user. The proximity sensor 552 can be used to detect proximity in the range of about one meter so that the thermostat 102 can initiate "waking up" when the user is approaching the thermostat and prior to the user touching the thermostat. Such use of proximity sensing is useful for enhancing the user experience by being "ready" for interaction as soon as, or very soon after the user is ready to interact with the thermostat. Further, the wake-up-on-proximity functionality also allows for energy savings within the thermostat by "sleeping" when no user interaction is taking place our about to take place.

According to some embodiments, for the combined purposes of inspiring user confidence and further promoting visual and functional elegance, the thermostat 102 is controlled by only two types of user input, the first being a rotation of the outer ring 512 as shown in FIG. 5A (referenced hereafter as a "rotate ring" or "ring rotation" input), and the second being an inward push on head unit 540 until an audible and/or tactile "click" occurs (referenced hereafter as an "inward click" or simply "click" input). For such embodiments, the head unit 540 is an assembly that includes all of the outer ring 512, cover 514, electronic display 516, and the Fresnel lens 510. When pressed inwardly by the user, the head unit 540 travels inwardly by a small amount, such as 0.5 mm, against an interior metallic dome switch (not shown), and then springably travels back outwardly by that same amount when the inward pressure is released, providing a satisfying tactile "click" sensation to the user's hand, along with a corresponding gentle audible clicking sound. Thus, for the embodiment of FIGS. 5A-5D, an inward click can be achieved by direct pressing on the outer ring 512 itself, or by indirect pressing of the outer ring by virtue of providing inward pressure on the cover 514, lens 510, or by various combinations thereof. For other embodiments, the thermostat 102 can be mechanically configured such that only the outer ring 512 travels inwardly for the inward click input, while the cover 514 and lens 510 remain motionless. It is to be appreciated that a variety of different selections and combinations of the particular mechanical elements that will travel inwardly to achieve the "inward click" input are within the scope of the present teachings, whether it be the outer ring 512 itself, some part of the cover 514, or some combination thereof. However, it has been found particularly advantageous to provide the user with an ability to quickly go back and forth between registering "ring rotations" and "inward clicks" with a single hand and with minimal amount of time and effort involved, and so the ability to provide an inward click directly by pressing the outer ring 512 has been found particularly advantageous, since the user's fingers do not need to be lifted out of contact with the device, or slid along its surface, in order to go between ring rotations and inward clicks. Moreover, by virtue of the strategic placement of the electronic display 516 centrally inside the rotatable ring 512, a further advantage is provided in that the user can naturally focus their attention on the electronic display throughout the input process, right in the middle of where their hand is performing its functions. The combination of intuitive outer ring rotation, especially as applied to (but not limited to) the changing of a thermostat's setpoint temperature, conveniently folded together with the satisfying physical sensation of inward clicking, together with accommodating natural focus on the electronic display in the central midst of their fingers' activity, adds significantly to an intuitive, seamless, and downright fun user experience. Further descriptions of advantageous mechanical user-interfaces and related designs, which are employed according to some embodiments, can be found in U.S. Ser. No. 13/033,573, U.S. Ser. No. 29/386,021, and U.S. Ser. No. 13/199,108, all of which are incorporated herein by reference.

FIGS. 5B and 5C are bottom and right side elevation views of the thermostat 102, which has been found to provide a particularly pleasing and adaptable visual appearance when viewed against a variety of different wall colors and wall textures in a variety of different home environments and home settings. While the thermostat itself will functionally adapt to the user's schedule as described herein and in one or more of the commonly assigned incorporated applications, the outer shape is specially configured to convey a "chameleon" quality or characteristic such that the overall device appears to naturally blend in, in a visual and decorative sense, with many of the most common wall colors and wall textures found in home and business environments, at least in part because it will appear to assume the surrounding colors and even textures when viewed from many different angles.

According to some embodiments, the thermostat 102 includes a processing system 560, display driver 564 and a wireless communications system 566. The processing system 560 is adapted to cause the display driver 564 and display 516 to display information to the user, and to receiver user input via the rotatable ring 512. The processing system 560, according to some embodiments, is capable of carrying out the governance of the operation of thermostat 102 including various user interface features. The processing system 560 is further programmed and configured to carry out other operations as described further hereinbelow and/or in other ones of the commonly assigned incorporated applications. For example, processing system 560 is further programmed and configured to maintain and update a thermodynamic model for the enclosure in which the HVAC system is installed, such as described in U.S. Ser. No. 12/881,463, and in International Patent App. No. PCT/US11/51579, both of which are incorporated herein by reference. According to some embodiments, the wireless communications system 566 is used to communicate with devices such as personal computers and/or other thermostats or HVAC system components, which can be peer-to-peer communications, communications through one or more servers located on a private network, or and/or communications through a cloud-based service.

According to some embodiments, for ease of installation, configuration and/or upgrading, especially by a non-expert installer such as a user, the thermostat 102 includes a head unit 540 and a backplate (or wall dock) 542. As is described hereinabove, thermostat 102 is wall mounted and has circular in shape and has an outer rotatable ring 512 for receiving user input. Head unit 540 of thermostat 102 is slidably mountable onto back plate 542 and slidably detachable therefrom. According to some embodiments the connection of the head unit 540 to backplate 542 can be accomplished using magnets, bayonet, latches and catches, tabs or ribs with matching indentations, or simply friction on mating portions of the head unit 540 and backplate 542. Also shown in FIG. 5A is a rechargeable battery 522 that is recharged using recharging circuitry 524 that uses power from backplate that is either obtained via power harvesting (also referred to as power stealing and/or power sharing) from the HVAC system control circuit(s) or from a common wire, if available, as described in further detail in co-pending patent application U.S. Ser. No. 13/034,674, and Ser. No. 13/034,678, which are incorporated by reference herein. According to some embodiments, rechargeable battery 522 is a single cell lithium-ion, or a lithium-polymer battery.

Figure 6A:
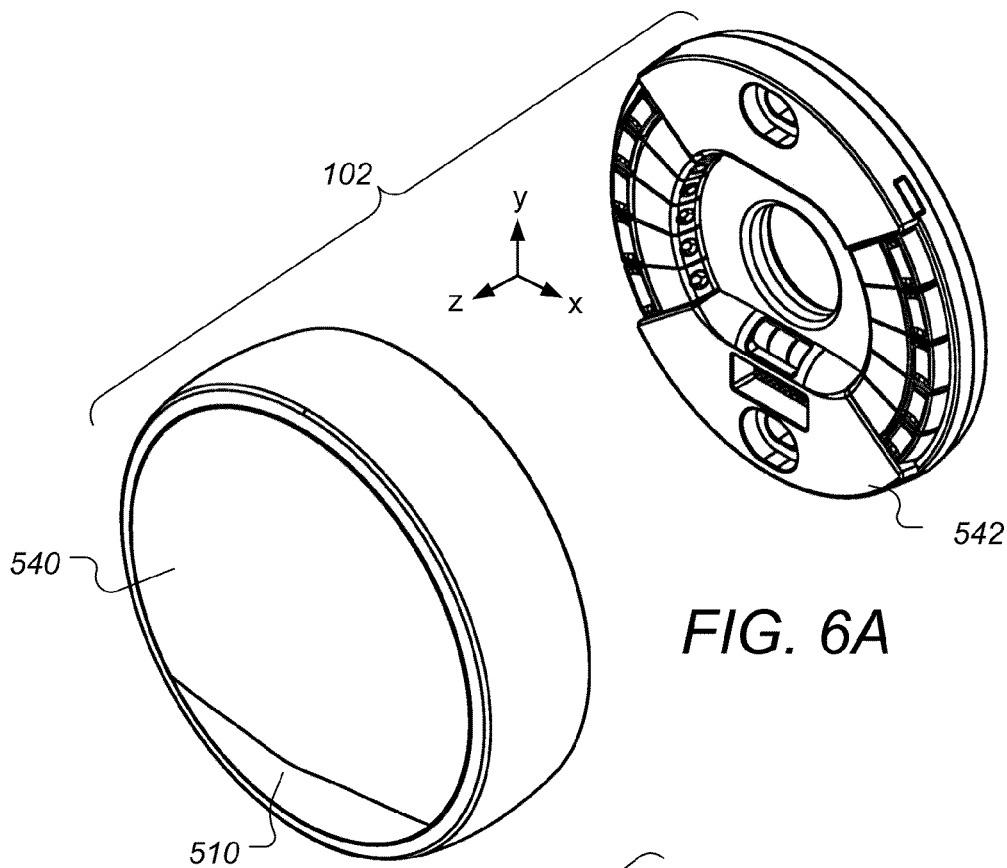
FIGS. 6A-6B illustrate exploded front and rear perspective views, respectively, of a thermostat with respect to its two main components, according to some embodiments.
Figure 6B:
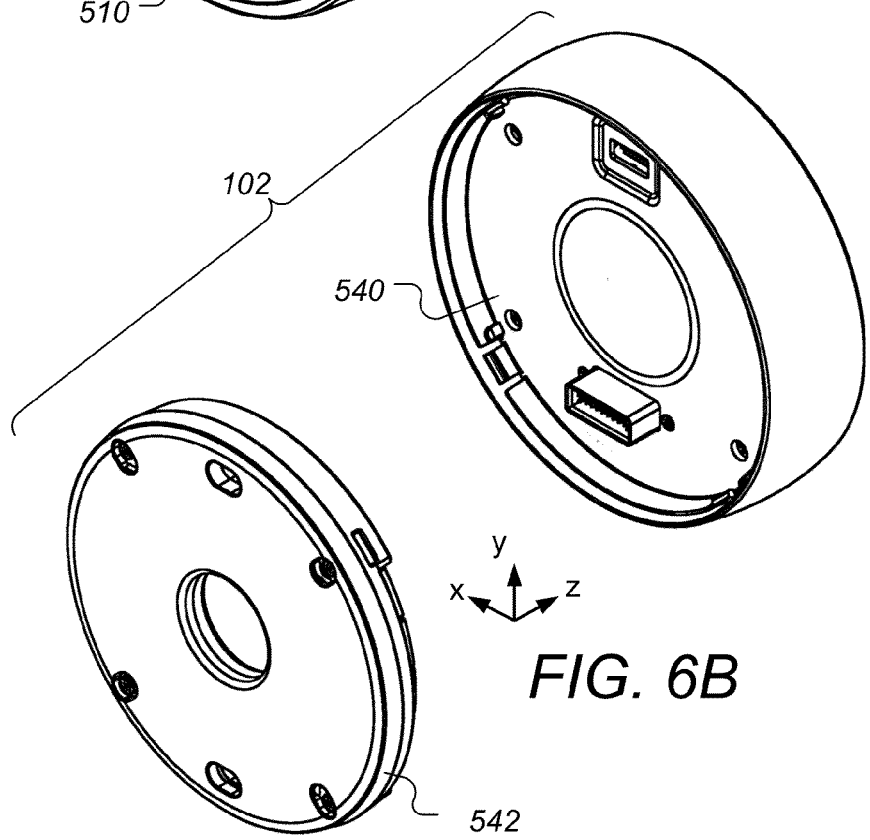

FIGS. 6A-6B illustrate exploded front and rear perspective views, respectively, of the thermostat 102 with respect to its two main components, which are the head unit 540 and the backplate 542. Further technical and/or functional descriptions of various ones of the electrical and mechanical components illustrated hereinbelow can be found in one or more of the commonly assigned applications, such as U.S. Ser. No. 13/199,108, incorporated herein by reference. In the drawings shown herein, the "z" direction is outward from the wall, the "y" direction is the toe-to-head direction relative to a walk-up user, and the "x" direction is the user's left-to-right direction.

Figure 6C:
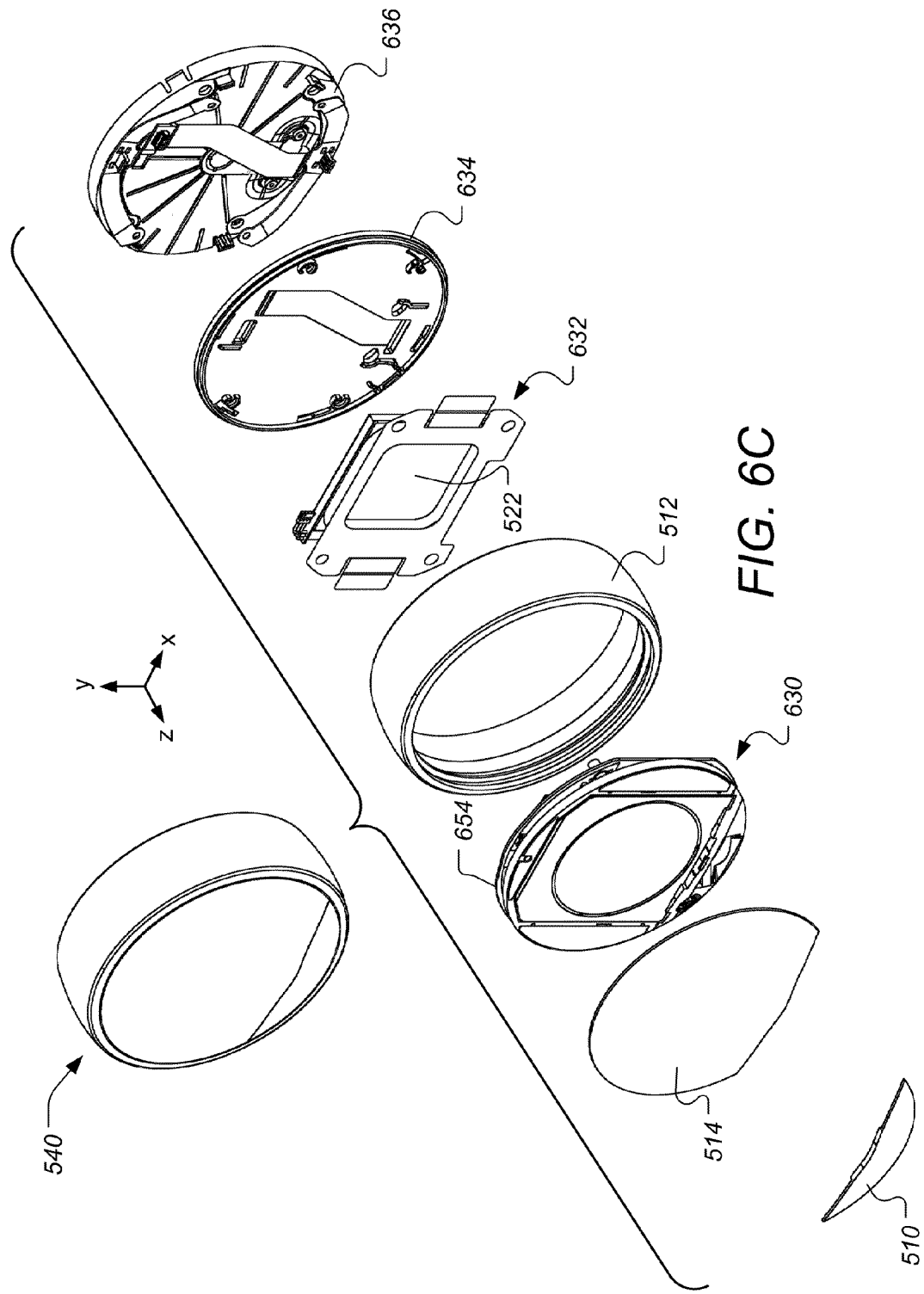
FIGS. 6C-6D illustrate exploded front and rear perspective views, respectively, of the head unit with respect to its primary components, according to some embodiments.
Figure 6D:
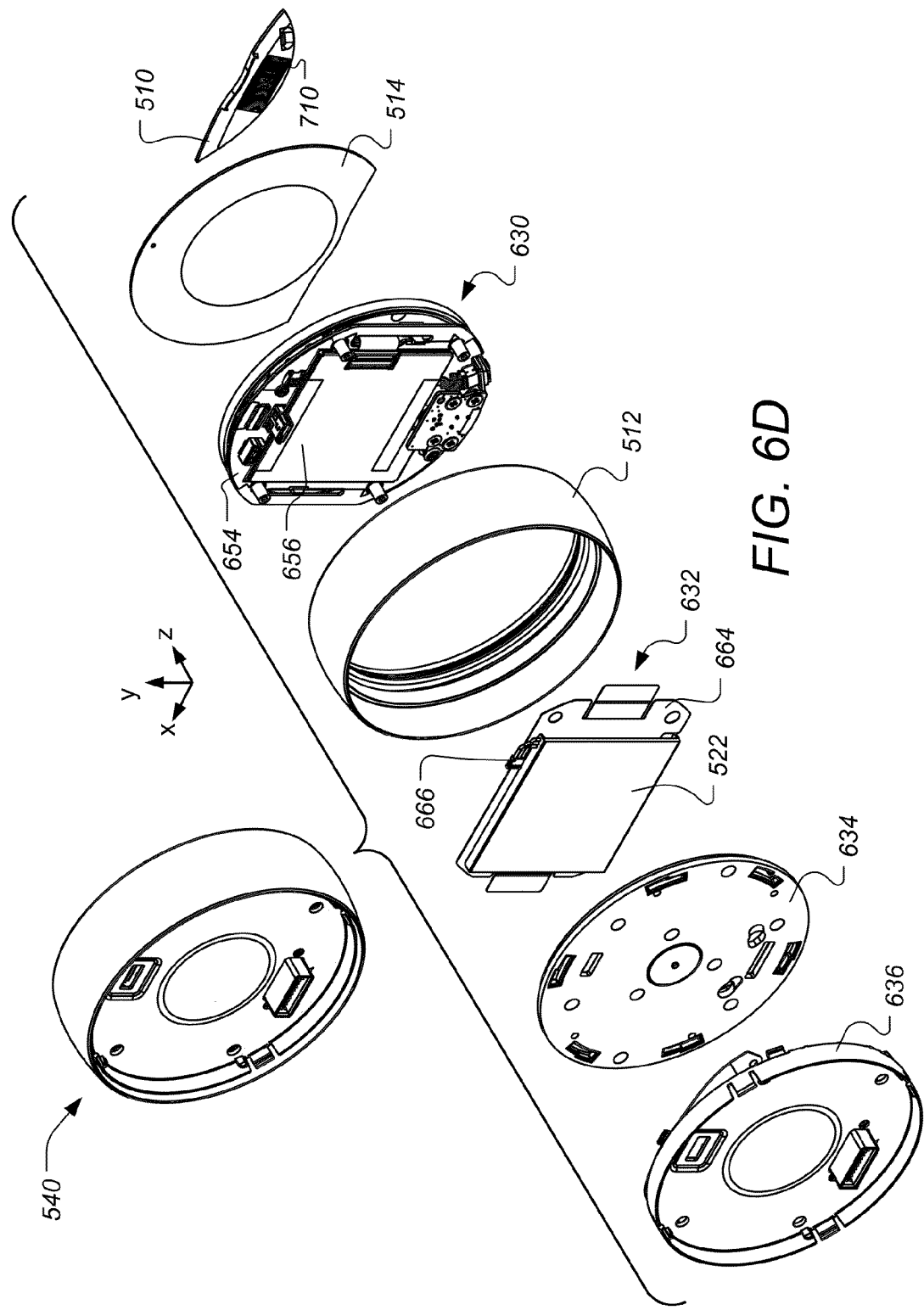

FIGS. 6C-6D illustrate exploded front and rear perspective views, respectively, of the head unit 540 with respect to its primary components. Head unit 540 includes, back cover 636, bottom frame 634, battery assembly 632, the outer ring 512 (which is manipulated for ring rotations), head unit frontal assembly 630, front lens 514, and Fresnel lens 510. Electrical components on the head unit frontal assembly 630 can connect to electrical components on the back plate 542 by virtue of ribbon cables and/or other plug type electrical connectors on back cover 636. Head unit frontal assembly 630 is secured to head unit back cover 636 and bottom frame 634 via four bosses. The outer ring 512 is thereby held between a bearing surface on the head unit top frame 652 (shown in FIGS. 6E and 6F, infra) and bearing surfaces on the bottom frame 634. In particular motion of the ring 512 in z direction is constrained by flat bearing surfaces on the top frame 652 and bottom frame 634, while motion of the ring in x and y directions are constrained by circular rounded surfaces on the bottom frame 634. According to some embodiments, the bearing surfaces of the bottom frame 634 and/or the top frame 652 are greased and/or otherwise lubricated to both smooth and dampen rotational movement for ring 512. Attached to top frame 652 is the head unit printed circuit board (PCB) 654 on which much of the head unit circuitry is mounted including some or all of processing system 560, display driver 564, wireless communication system 566 and battery recharging circuitry 524 as shown and described with respect to FIG. 5A, as well as one or more additional memory storage components. According to some embodiments, circuitry and components are mounted on both sides of PCB 654. A shielding can 656 (visible in FIG. 6D) surrounds most or all of the head unit circuitry and components on PCB 654 and serves to shield the circuitry and components from electromagnetic interference. Although not visible, according to some embodiments, shielding can 656 surrounds circuitry and components on both sides of PCB 654.

Battery assembly 632 includes a rechargeable Lithium-Ion battery 522, which for one preferred embodiment has a nominal voltage of 3.7 volts and a nominal capacity of 560 mAh. To extend battery life, however, the battery 522 is normally not charged beyond 450 mAh by the thermostat battery charging circuitry. Moreover, although the battery 522 is rated to be capable of being charged to 4.2 volts, the thermostat battery charging circuitry normally does not charge it beyond 3.95 volts. Battery assembly 632 also includes connecting wires 666, and a battery mounting film 664 that is attached to battery 522 using a strong adhesive and to the rear shielding can 656 of head unit PCB 654 using a relatively weaker adhesive. By using a weaker adhesive to mount the film 664 of battery assembly 632 to shielding can 656 of the PCB 654, subsequent replacement of battery assembly 632 (including battery 522) is facilitated. According to some embodiments, the battery assembly 632 is user-replaceable.

Figure 6E:
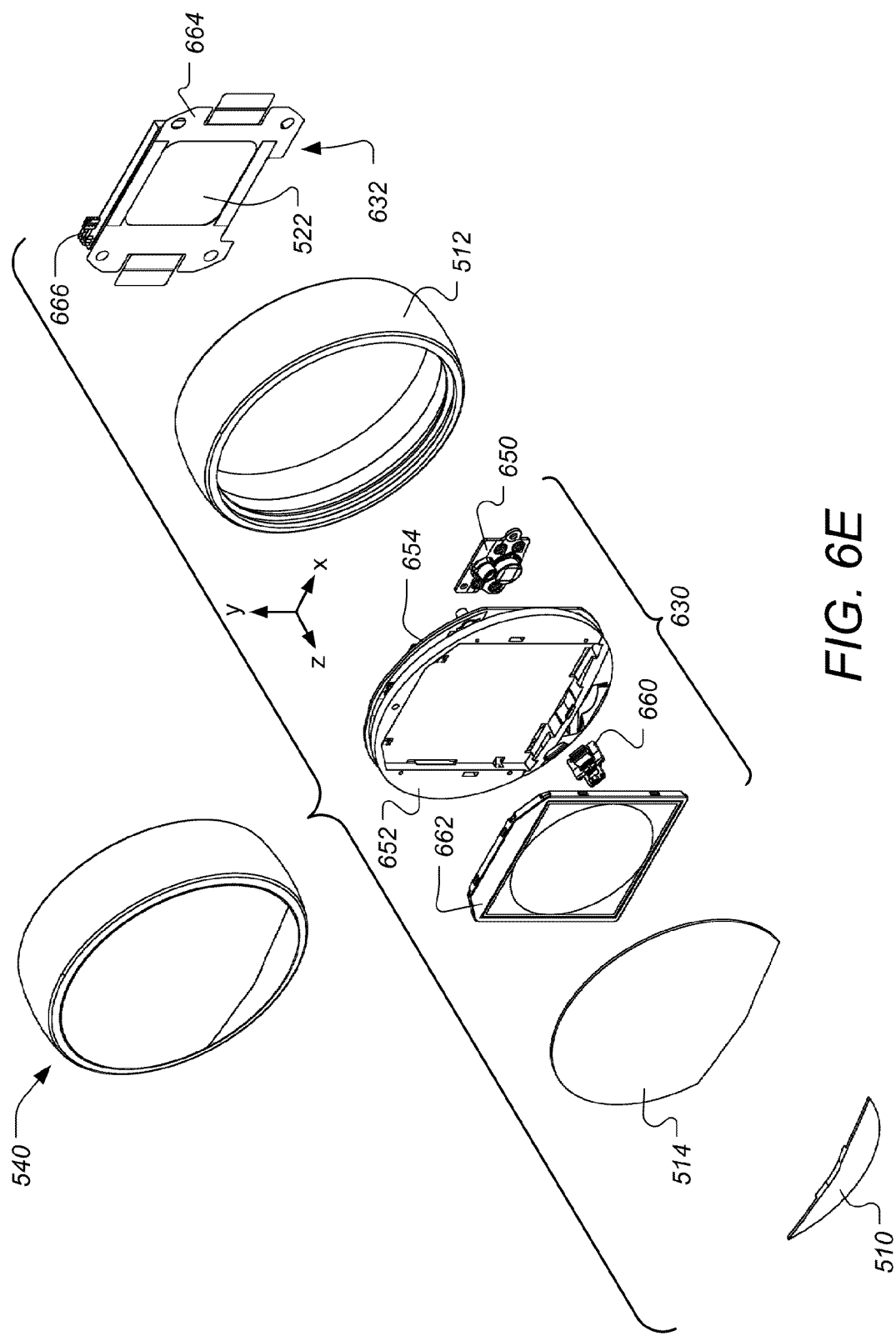
FIGS. 6E-6F illustrate exploded front and rear perspective views, respectively, of the head unit frontal assembly with respect to its primary components, according to some embodiments.
Figure 6F:
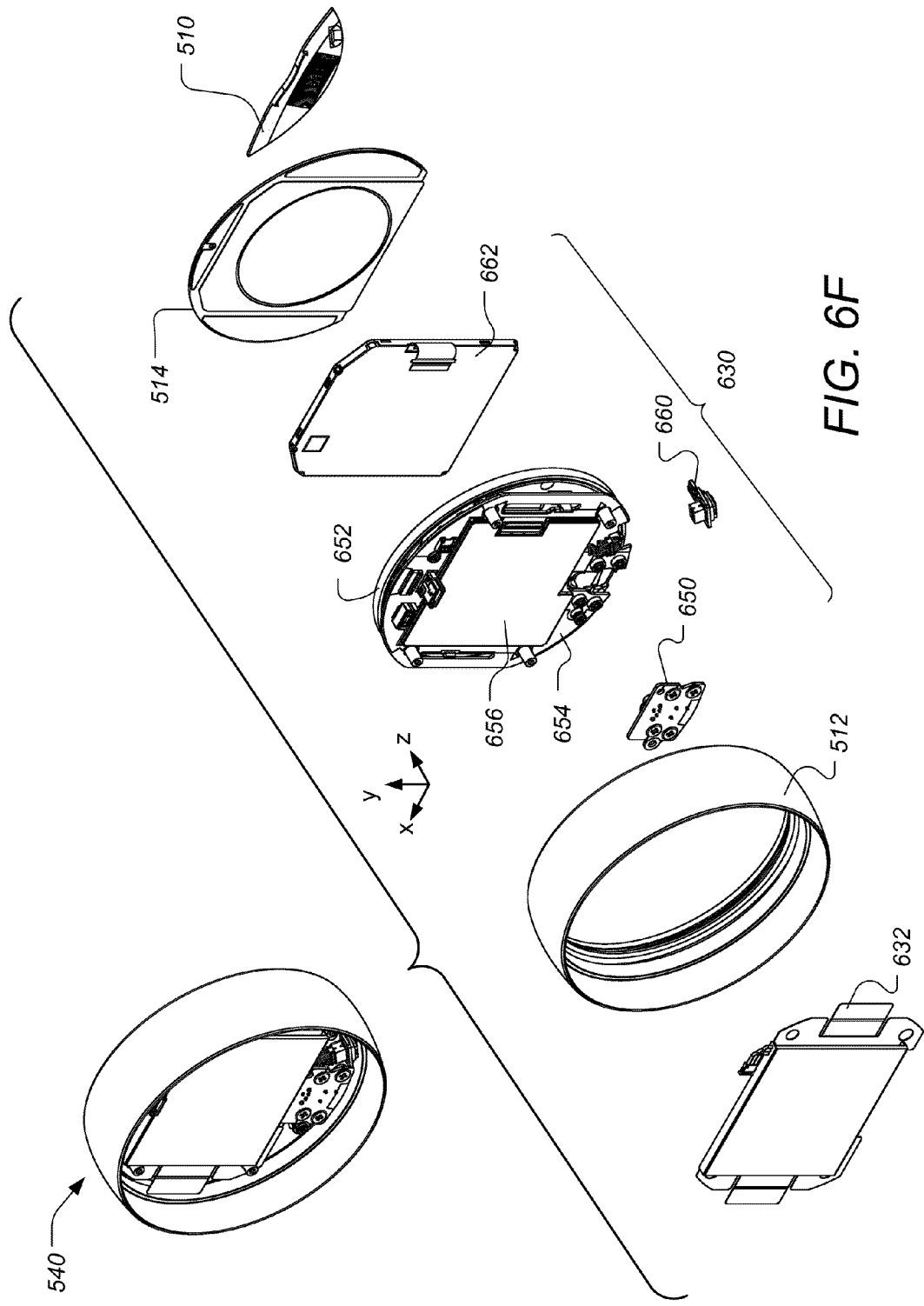

FIGS. 6E-6F illustrate exploded front and rear perspective views, respectively, of the head unit frontal assembly 630 with respect to its primary components. Head unit frontal assembly 630 comprises a head unit top frame 652, head unit PCB 654, and LCD module 662. Daughter board 660 connects to the head unit PCB 654 and includes an optical finger navigation (OFN) module that is configured and positioned to sense rotation of the outer ring 512. The OFN module is directed radially outwardly (that is, perpendicular to the z-axis and away from the center of the thermostat). The OFN module uses methods analogous to the operation of optical computer mice to sense the movement of a textured surface on an inner face of the outer ring 512. Notably, the OFN module is one of the very few sensors that is controlled by the relatively power-intensive head unit microprocessor rather than the relatively low-power back plate microprocessor. This is achievable without excessive power drain implications because the head unit microprocessor will invariably be awake already when the user is manually turning the dial, so there is no excessive wake-up power drain anyway. Advantageously, very fast response can also be provided by the head unit microprocessor. Also visible in FIGS. 6E and 6F is Fresnel lens 510 that operates in conjunction with two PIR motion sensors mounted on PIR board 650. Two or more temperature sensors are also located in the head unit 540 and cooperate to acquire reliable and accurate room temperature data. One of the temperature sensors is located on daughter board 660 and the other is mounted on the head unit PCB 654.

FIGS. 6G-6H illustrate exploded front and rear perspective views, respectively, of the back plate unit 542 with respect to its primary components, according to some embodiments. Back plate unit 542 comprises a back plate rear plate 682, a back plate circuit board 680, and a back plate cover 670. Visible in FIG. 6G are the HVAC wire connectors 684 that include integrated mechanical wire insertion sensing circuitry, and relatively large capacitors 686 that are used by part of the power stealing circuitry that is mounted on the back plate circuit board 680. According to some embodiments, backplate 542 includes electronics and a temperature/humidity sensor in housing. Wire connectors 684 are provided to allow for connection to HVAC system wires, which pass though the large central circular opening 690, which is visible in each of the backplate primary components. Also visible in each of the backplate primary components are two mounting holes 692 and 694 for use in fixing the backplate to the wall. The single top wall-mounting hole 692 on backplate has been found to allow for self-leveling during installation, thereby further enhancing the ease of a non-expert installation of the thermostat 102. Also visible in FIGS. 6G and 6H are bubble level 672 and holder 674 for further facilitating user-installability of the thermostat 102.

Figure 7A:
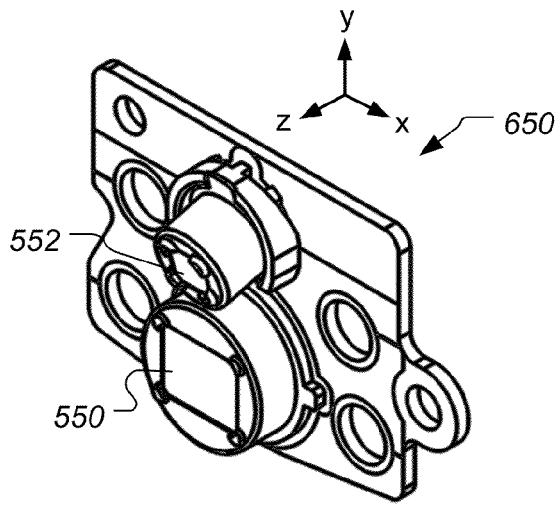
FIGS. 7A-7B show front and rear perspective views, respectively, of a passive infrared sensor board, according to some embodiments.
Figure 7B:
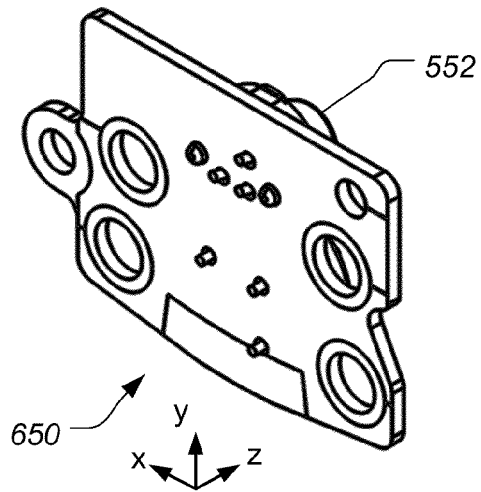
Figure 7C:
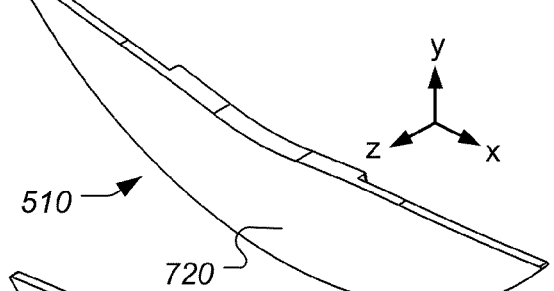
FIGS. 7C-7D show front and rear perspective views, respectively, of a Fresnel lens, according to some embodiments.
Figure 7D:
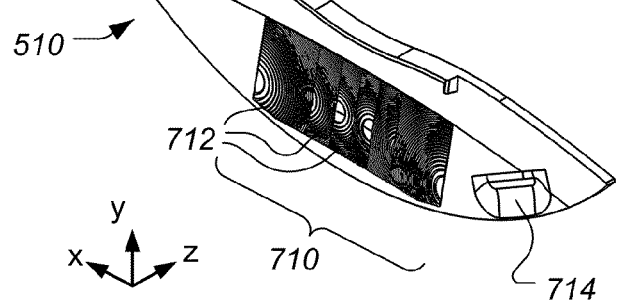

FIGS. 7A-7B show front and rear perspective views, respectively, of the PIR board 650, according to some embodiments. The larger PIR sensor 550 is mounted parallel to the wall (i.e. the sensor plane is perpendicular to the z-axis), and is used to detect motion associated with occupancy. The smaller PIR sensor 552 is located above the larger PIR sensor 550 and is angled slightly downwards, so as to improve detection of an approaching user. FIGS. 7C and 7D show front and rear perspective views, respectively, of the Fresnel lens 510, according to some embodiments. As can be seen in FIG. 7C, the front exterior surface 720 of Fresnel lens 510 is smooth and curved so as to be integrated with the shape of rest of the outer surface of the thermostat 102, namely the outer surface of the cover 514 and the front edge of outer ring 512, as shown in FIGS. 5A-5D, supra. In addition to having the contour of the front surface 720 of lens 510 matched to rest of the front surface of thermostat 102, having a color match between the surface 720 of lens 510 and the outer portion 514o of cover 514 has also been found create a visually pleasing device as well as enhance the user interface by lessening any distraction to the user. According to some embodiments, the outer portion 514o of cover 514 is smoked or painted black, and the lens 510 is made from a black color HDPE material that has an infrared transmission range appropriate for sensitivity to human bodies.

As can be seen in FIG. 7D, on the inner, or rear surface of Fresnel lens 510 the Fresnel lens elements 710 are formed, including six separate lenslets 712. Each of the 6 lenslets 712, is a separate Fresnel lens. Each lenslet should be designed depending on the location and orientation in the system with respect to the PIR sensors, as well as depending on the monitoring area desired to be viewable by the PIR sensors. In selecting the number of lenslets, there is a tradeoff between light collection and size of each zone. It has been found the 6-element lens is suitable for a wide-range of applications, although other numbers and sizes of lenslets can be used. Also visible in FIG. 7D is carved out section 714 for positioning of a temperature sensor that is mounted on the daughter board 660 shown in FIGS. 6E and 6F.

Figure 7E:
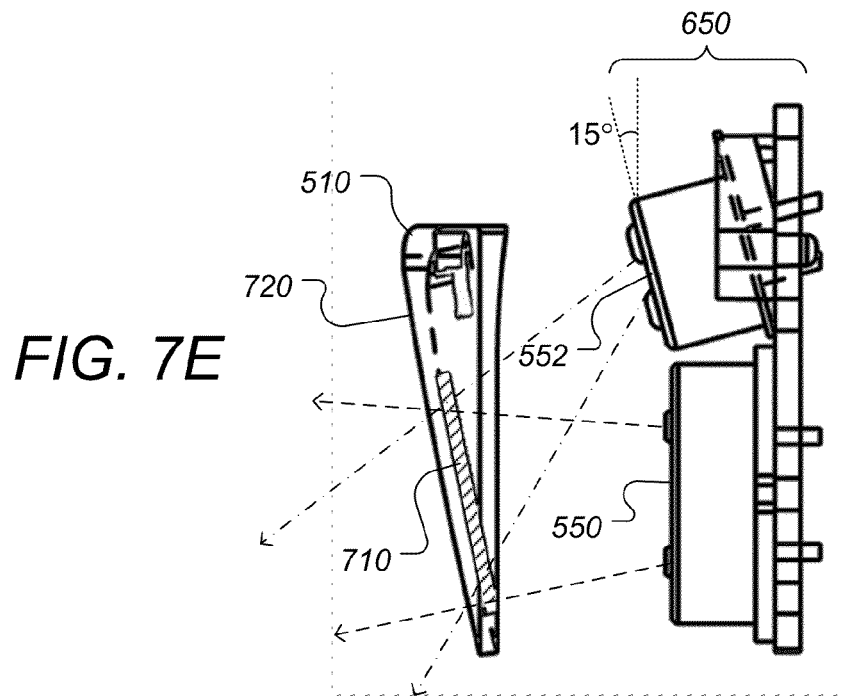
FIGS. 7E-7F are a side view and cross section view, respectively, showing the relative positioning of passive infrared sensors and a Fresnel lens, according to some embodiments.
Figure 7F:
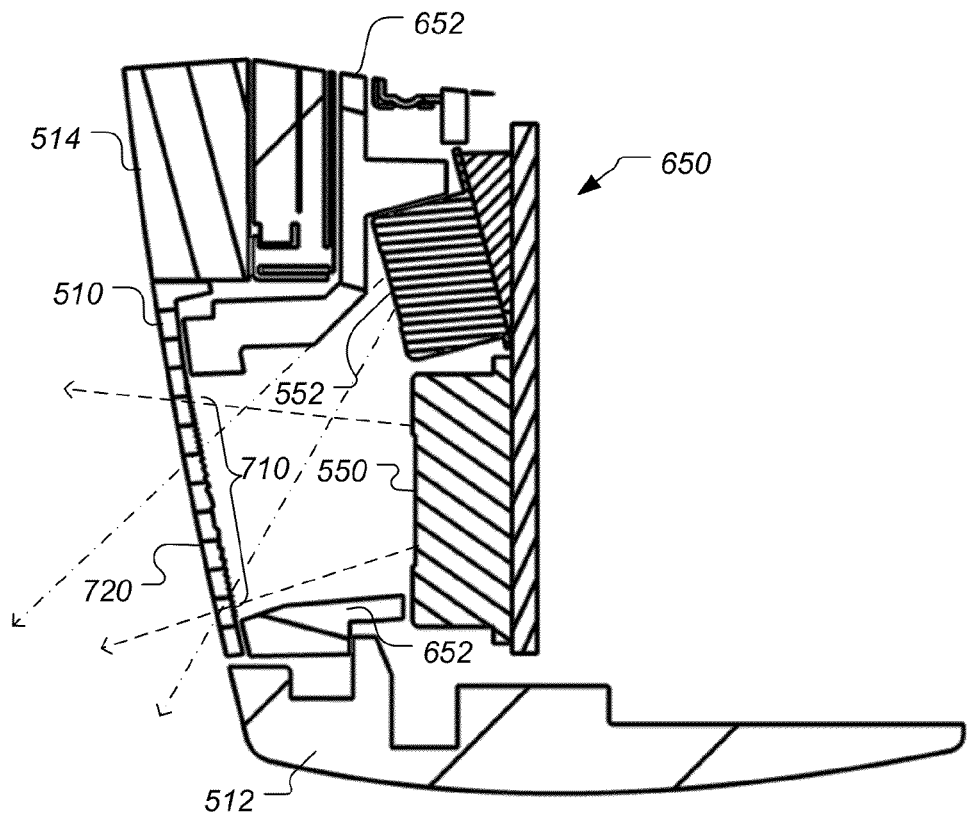

FIGS. 7E and 7F are a side view and cross section view, respectively, showing the relative positioning of the PIR sensors and the Fresnel lens, according to some embodiments. The approximate field of view of the larger PIR sensor 550 is shown by the dashed arrows, and the approximate field of view of the smaller PIR sensor 552 is shown by the dashed-dotted arrows. As can be seen the larger PIR sensor 550 used for occupancy has a primarily front-facing field of view while the smaller PIR sensor 552 used for anticipating an user wishing to directly interact with the thermostat has a primarily downward-facing field of view. Note that in the embodiments shown, an internal surface of the top frame 652 partially obscures the field of view of PIR sensor 552 so as to further limit the sensor's sensitivity motion relatively close to the thermostat. Note that in the embodiments shown, the PIR sensor 552 is directed through the same Fresnel lens 510 as the forward facing PIR sensor 550. According to some alternate embodiments separate lenslets can be used for the smaller PIR sensor 552, or an entirely different lens piece could be used.

Figure 8B:
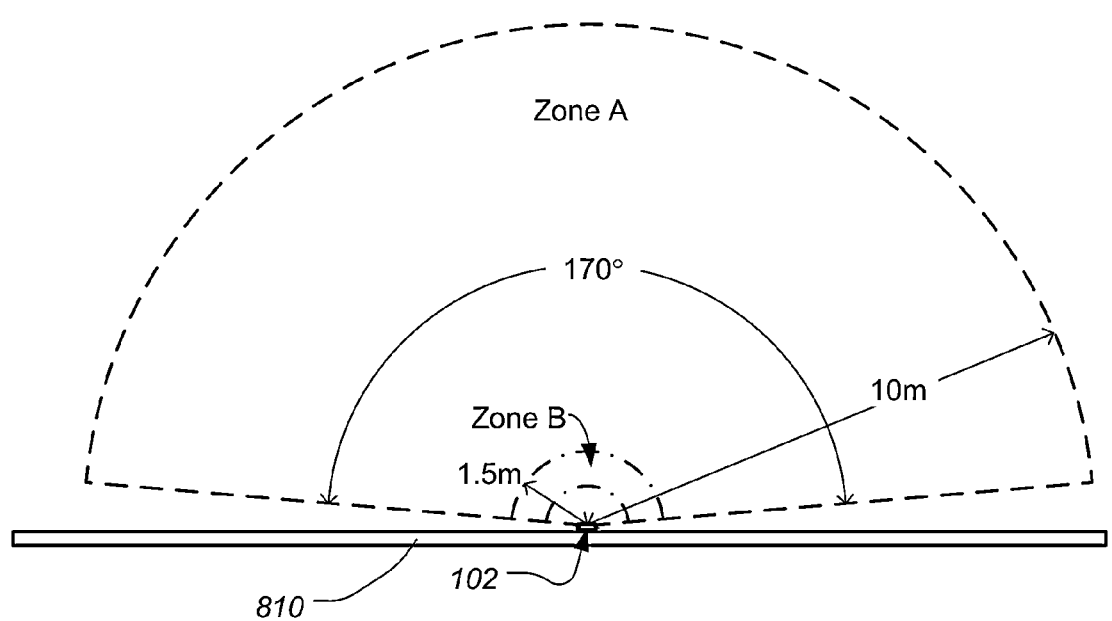

FIGS. 8A-8B are diagrams illustrating considerations in designing forward looking and downward looking PIR sensor fields of view, according to some embodiments. Thermostat 102 is shown mounted on a wall 810. PIR sensor 552 within the thermostat 510 has a downwardly directed field of view as shown by the dashed-dotted arrows. An approaching user 800 who may wish to imminently interact with the thermostat 102. In order to conserve power in its rechargeable battery, thermostat 102 turns off or puts certain components to sleep, such as its head unit microprocessor, LCD display, etc. It has been found that anticipating an approaching user greatly improves the user's interactive experience with the thermostat since the sleeping components can be woken up before the user actually touches the thermostat. In general, the longer it takes for the components to wake-up, the further away the distance d should be designed. However, there is a trade-off since having a larger distance d causes more "false alarms" in which the thermostat wakes when a user simply is walking past the thermostat. In designing the downward field of view of the second PIR sensor 552, a cone or zone on the floor immediately in front of the wall-mounted thermostat should be considered. It has been found that downward tilting of the face of sensor 552 by 15 degrees, as shown in FIG. 7E, is suitable given the internal structures and the view through the Fresnel lens 510. Tilting the sensor 552 has been found to reduce losses due to reflections (allowing more energy to reach the sensor 552), as well as increase the amount of sensor area that can "see" through the Fresnel lens pattern 710 on lens 510. It has been found that the distance d should be about 1-2 meters, which typically allows for adequate time for the head unit microprocessor and LCD display to turn on (which takes less than 1 second) before the user touches the unit. A distance of between 1-2 meters has been found to provide suitable advanced warning for waking up the head unit, without causing too many false alarms (e.g. waking the head unit when someone just walks by). In particular, according to some embodiments a maximum view angle of 45 degrees for the sensor 552 for an average wall mounting height of 1.5 meters has been found to be suitable for a distance d of 1.5 meters. Also shown in FIG. 8A is the vertical field of view of the larger PIR sensor 550. It has been found for occupancy sensing purposes a vertical field of view from three degrees above horizontal to 13 degrees below horizontal (about 16 degrees total) is suitable. The field of view of sensor 550 is shown as Zone A, and the field of view of the sensor 552 is shown as Zone B.

In FIG. 8B shows the horizontal fields of view of the PIR sensors, according to some embodiments. It has been found that horizontal field of view of about 170 degrees can be achieved and is suitable for these applications. A suitable range of the occupancy sensing PIR 550 is about 10 meters, according to some embodiments, as shown in FIG. 8B.

Figure 9A:
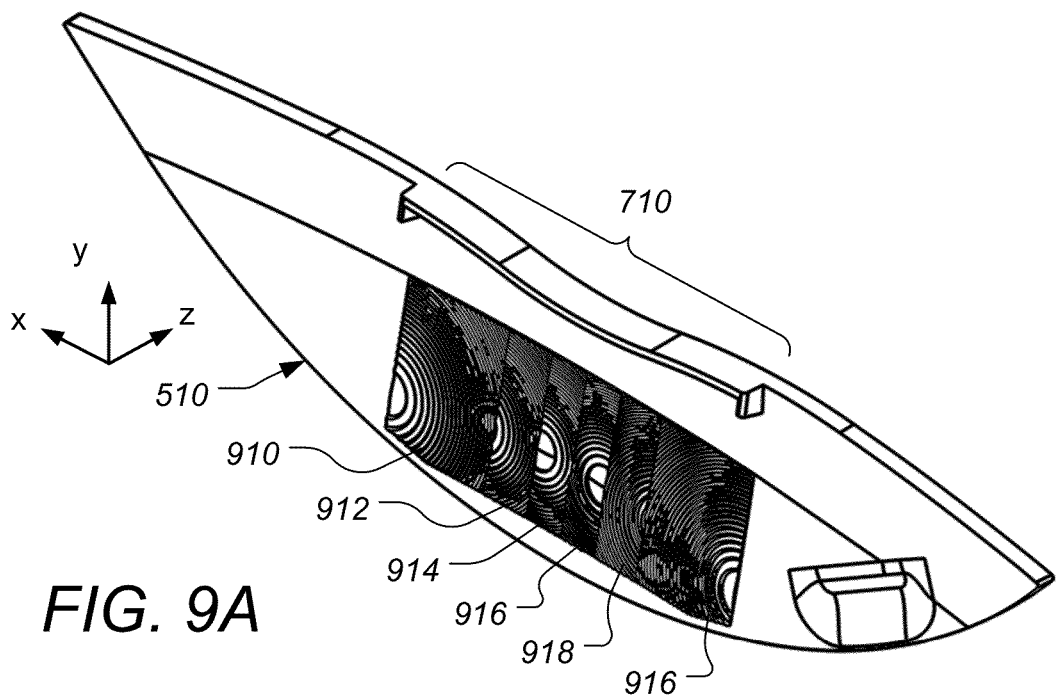
FIGS. 9A-9C show further detail of design consideration for a Fresnel lens, according to some embodiments.
Figure 9B:
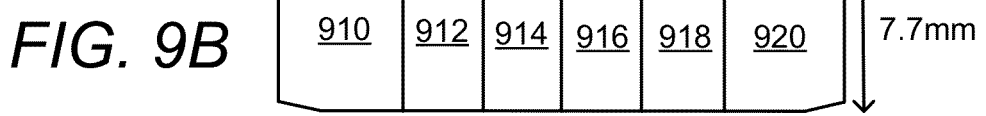
Figure 9C:
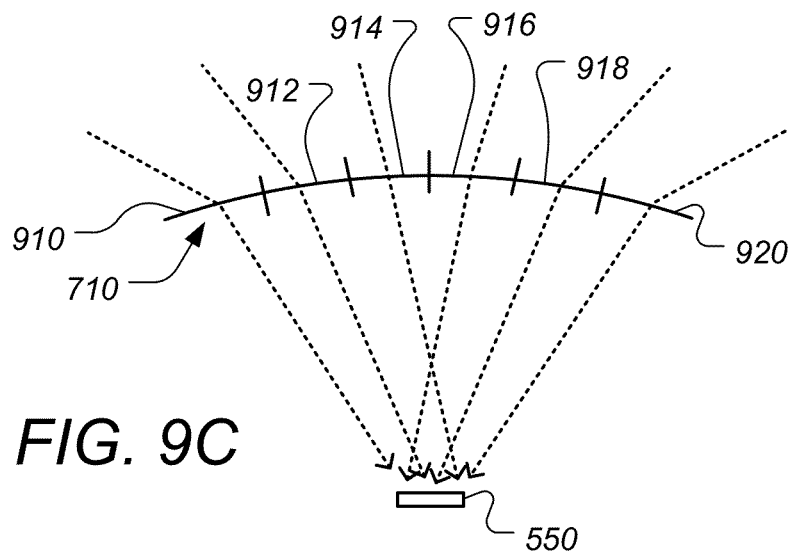

FIGS. 9A-9C show further detail of design consideration for a Fresnel lens, according to some embodiments. FIG. 9A shows a rear view of the Fresnel lens 510 including a lens portion 710 that consists of six individual lenslets 910, 912, 914, 916, 918 and 920. The horizontal and vertical angular coverage of the each lenslet 910, 912, 914, 916, 918 and 920, should be evaluated for each of the two PIR sensors 550 and 552 as shown for in FIGS. 8A-8B. Additionally, the relative lenslet efficiency should also be evaluated, in designing a suitable Fresnel lens. FIG. 9B shows the dimensions of each of the six lenslets 910, 912, 914, 916, 918 and 920, according to some embodiments. In the design shown, the Fresnel lens 510 is curved to match the outer curved surface of the thermostat, which is a sphere of about 135.7 mm radius. Each lenslet 910, 912, 914, 916, 918 and 920 can be modeled as a rectangle that is tilted corresponding to the individual off-axis segments on the sphere. The effective focal length of each lenslet and the placement of the focal center points of each lenslet should be designed so as to compensate for the lenslets being on a spherical surface so that the Fresnel lens 510 can match the contour of the overall thermostat front exterior. In the design shown, it has been found that an effective focal length of 9 mm for the two outer lenslets 910 and 920, and 7.7 mm for the four central lenslets 912, 914, 916 and 918.

Additionally, the centers of the lenslets are displaced vertically and horizontally to maintain the desired vertical angle of coverage for Zone A (for PIR sensor 550). FIG. 9C shows an example of simple ray trace diagram showing infrared energy paths through each lenslet to sensor 550. Note that for motion detection the sensor surface 550 should be considered at two slightly horizontally separated sensor areas, each having its own field of view for each of the six lenslets. Similarly for sensor 552 an approaching user can be detected using two areas on sensor 552 separated by a vertical distance.

Figure 10A:
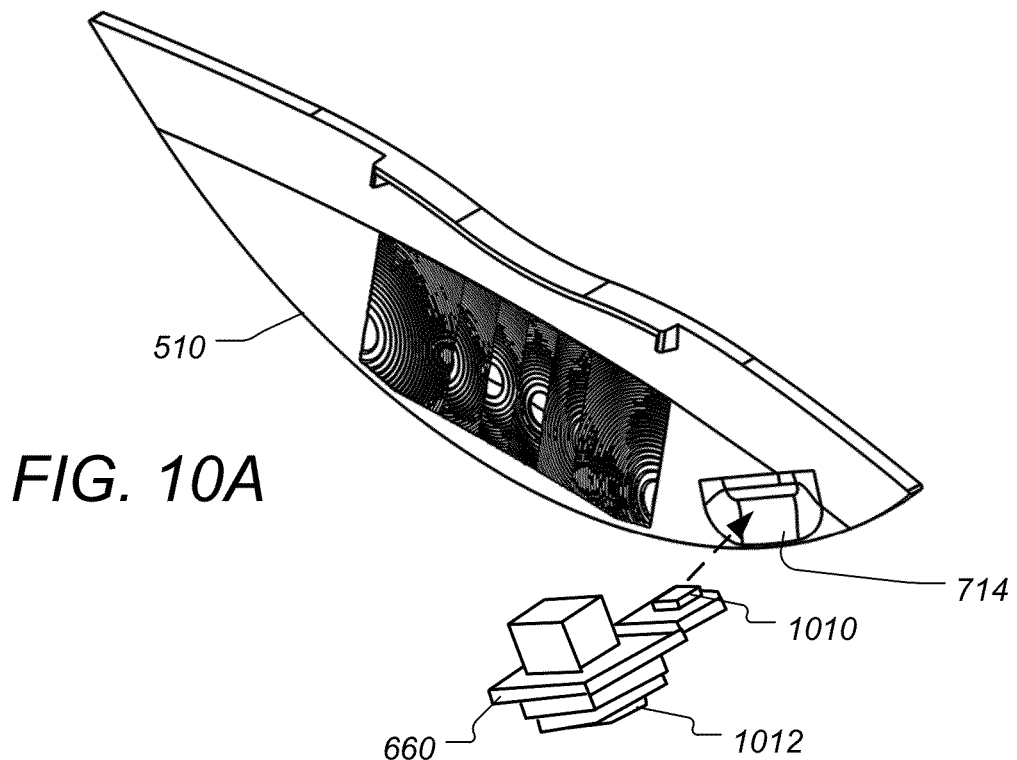
FIGS. 10A-10B are perspective and cross-section views, respectively, showing a temperature sensor mounted on a daughter board and thermally coupled to the Fresnel lens, according to some embodiments.
Figure 10B:
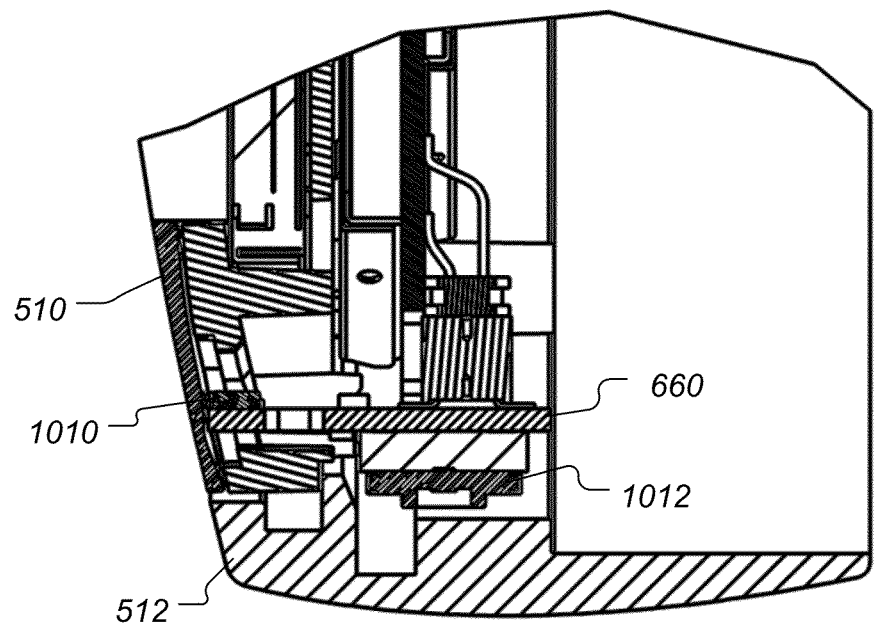

FIGS. 10A-10B are perspective and cross-section views, respectively, showing a temperature sensor mounted on a daughter board and thermally coupled to the Fresnel lens, according to some embodiments. The temperature sensor 1010 is mounted just behind and is thermally coupled to the Fresnel lens 510. The temperature sensor 1010 is mounted on daughter board 660, which is also used to mount OFN module 1012 for sensing rotational motion of the outer ring 512. The temperature sensor 1010 is positioned such that it is very close to a carved out section 714 of the Fresnel lens piece 510. According to some embodiments, thermal grease is used between the temperature sensor 1010 and the HDPE material of lens 510 in order to enhance thermal transfer between the ambient air outside the thermostat. FIG. 10B is a cross section showing the relative position of the temperature sensor 1010 and the Fresnel lens 510.

According to some embodiments, a second temperature sensor is also used for detect ambient temperature. The second temperature sensor is mounted on head unit PCB 654 (shown in FIGS. 6C, 6D, 6E and 6F). By mounting the second temperature sensor closer to the various heat sources within the thermostat 102, the difference between the two sensor readings can be used to the decrease effect of heat source on ambient temperature readings. Such use of two separated temperature sensor, one being under much greater influence of internal heat sources than the other, significantly increases accuracy of ambient temperature calculations without the use of significant venting which would distract from the overall visually pleasing appearance and user interface experience. For further details on ambient temperature calculations based on two separated temperature sensors, see co-pending U.S. patent application Ser. No. 13/199,108, which is incorporated by reference herein.

Although the integrated shaped Fresnel lens has been thus far described with respect to a thermostat, according to some embodiments the integrated shaped Fresnel lens can be used in a number of other devices that use PIR for occupancy detection and/or user interaction anticipation, especially for devices in visually pleasing exterior design is important. Examples include: home alarm systems, hazard detection units; entryway interface devices, wall light switches, wall plug interfaces, appliances such as ovens, refrigerators, wall air conditioners, televisions, washers and dryers, lights, stereos, intercom systems, garage door openers, floor fans, and pool heating systems, some of which are shown in FIG. 1.

Various modifications may be made without departing from the spirit and scope of the invention. It is to be further appreciated that the term thermostat, as used hereinabove and hereinbelow, can include thermostats having direct control wires to an HVAC system, and can further include thermostats that do not connect directly with the HVAC system, but that sense an ambient temperature at one location in an enclosure and cooperatively communicate by wired or wireless data connections with a separate thermostat unit located elsewhere in the enclosure, wherein the separate thermostat unit does have direct control wires to the HVAC system. Accordingly, the invention is not limited to the above-described embodiments, but instead is defined by the appended claims in light of their full scope of equivalents.

What is claimed is:

1. An occupancy-sensing thermostat comprising:
a thermostat body;
an electronic display that is viewable by a user in front of the thermostat;
a passive infrared sensor for measuring infrared energy;
an infrared energy directing element shaped conformally with a front surface of the thermostat body such that a visually pleasing appearance of the thermostat body is maintained, said passive infrared sensor being positioned behind said infrared energy directing element such that infrared energy is directed thereonto by said infrared energy directing element;
a first temperature sensor in thermal communication with the front surface of the thermostat body for making temperature measurements used for a calculating an ambient temperature; and
a second temperature sensor positioned within the thermostat body in a location closer than the first temperature sensor to one or more heat generating components within the thermostat body, wherein the calculation of ambient temperature is based at least in part on a comparison between measurements from the first and second temperature sensors;
wherein occupancy is detected based at least in part on measurements made by the passive infrared sensor.

2. A thermostat according to claim 1 wherein the first temperature sensor is in thermal communication with the front surface of the thermostat body using thermal grease.

3. A thermostat according to claim 1 wherein the first temperature sensor is located behind the infrared energy directing element.

4. A thermostat according to claim 1 further comprising a second passive infrared sensor for measuring infrared energy, the infrared energy directing element being shaped and the second passive infrared sensor being positioned such that it is provided with a substantially downwardly directed field of view when the thermostat is wall mounted, and the thermostat detecting an approaching user that will likely directly interact with the thermostat based at least in part on the measurements made by the second passive infrared sensor.

5. A thermostat according to claim 1 wherein the passive infrared sensor, the first temperature sensor, and the second temperature sensor are located in a common chamber of the thermostat body.

6. A thermostat according to claim 1 wherein the passive infrared sensor, the first temperature sensor, and the second temperature sensor are located behind the infrared energy directing element.

7. A thermostat according to claim 1 wherein the infrared energy directing element comprises a smooth outer surface that extends across only a portion of a curved exterior front surface of the thermostat body, the infrared energy directing element being shaped and curved so as to conform to and form a part of the curved exterior front surface of the thermostat body.

8. A thermostat according to claim 1 further comprising a mechanically rotatable annular ring surrounding the electronic display and the infrared energy directing element, the annular ring being rotatable around a front-to-back axis of the thermostat, and said annular ring is inwardly pressable along a direction of the front-to-back axis.

9. A method of measuring an ambient temperature using an occupancy-sensing thermostat, the method comprising:

operating a thermostat that comprises a thermostat body and an electronic display that is viewable by a user in front of the thermostat;

directing infrared energy onto a passive infrared sensors using an infrared energy directing element shaped conformally with a front surface of the thermostat body such that a visually pleasing appearance of the thermostat body is maintained, said passive infrared sensor being positioned behind said infrared energy directing element such that infrared energy is directed thereonto by said infrared energy directing element;

taking a first temperature measurement by a first temperature sensor, said first temperature sensor being in thermal communication with the front surface of the thermostat body for making temperature measurements used for a calculating an ambient temperature;

taking a second temperature measurement by a second temperature sensor, the second temperature sensor being positioned within the thermostat body in a location closer than the first temperature sensor to one or more heat generating components within the thermostat body;

calculating the ambient temperature based at least in part on a comparison between measurements from the first and second temperature sensors; and detecting occupancy based at least in part on measurements made by the passive infrared sensor.

10. The method of claim 9 wherein the first temperature sensor is in thermal communication with the front surface of the thermostat body using thermal grease.

11. The method of claim 9 wherein the first temperature sensor is located behind the infrared energy directing element.

12. The method of claim 9 wherein the thermostat further comprises a second passive infrared sensor for measuring infrared energy, the infrared energy directing element being shaped and the second passive infrared sensor being positioned such that it is provided with a substantially downwardly directed field of view when the thermostat is wall mounted, the method further comprising detecting an approaching user that will likely directly interact with the thermostat based at least in part on the measurements made by the second passive infrared sensor.

13. The method of claim 9 wherein the passive infrared sensor, the first temperature sensor, and the second temperature sensor are located in a common chamber of the thermostat body.

14. The method of claim 9 wherein the passive infrared sensor, the first temperature sensor, and the second temperature sensor are located behind the infrared energy directing element.

15. The method of claim 9 wherein the infrared energy directing element comprises a smooth outer surface that extends across only a portion of a curved exterior front surface of the thermostat body, the infrared energy directing element being shaped and curved so as to conform to and form a part of the curved exterior front surface of the thermostat body.

16. The method of claim 9 wherein the thermostat further comprises a mechanically rotatable annular ring surrounding the electronic display and the infrared energy directing element, the annular ring being rotatable around a front-to-back axis of the thermostat, and said annular ring is inwardly pressable along a direction of the front-to-back axis.

* * * * *